United States Patent [19]

Joardar et al.

[11] Patent Number: 5,687,355

[45] Date of Patent: Nov. 11, 1997

[54] APPARATUS AND METHOD FOR MODELING A GRADED CHANNEL TRANSISTOR

[75] Inventors: Kuntal Joardar, Chandler, Ariz.; Kiran Kumar Gullapalli, Austin, Tex.

[73] Assignee: Motorola, Inc., Schaumburg, Ill.

[21] Appl. No.: 517,046

[22] Filed: Aug. 21, 1995

[51] Int. Cl.[6] .......................... G06F 9/455; G06F 17/50
[52] U.S. Cl. .................. 395/500; 364/578; 364/221.2; 364/232.3; 364/264.3; 364/275.6
[58] Field of Search ............................ 364/488–491, 364/578; 395/500

[56] References Cited

U.S. PATENT DOCUMENTS

| | | | |
|---|---|---|---|
| 4,839,702 | 6/1989 | Grinberg et al. | 357/16 |
| 5,208,475 | 5/1993 | Montensen | 257/360 |
| 5,345,401 | 9/1994 | Tani | 364/578 |
| 5,467,291 | 11/1995 | Fan et al. | 364/578 |
| 5,481,485 | 1/1996 | Takeuchi | 364/578 |
| 5,502,643 | 3/1996 | Fujinaga | 364/488 |
| 5,553,008 | 9/1996 | Huang et al. | 364/578 |
| 5,600,578 | 2/1997 | Fang et al. | 364/578 |

*Primary Examiner*—Kevin J. Teska
*Assistant Examiner*—Ayni Mohamed
*Attorney, Agent, or Firm*—Keith E. Witek

[57] ABSTRACT

The present invention generates a model of a graded channel transistor having at least two channel portions of differing doping concentrations. The present invention assumes a uniform doping concentration of each channel portion. Each of the channel portions is modeled using a standard transistor model (100, 120) with junction voltages (64) resulting between the transistor models. The junction voltages (64) are determined to be at a level such that the channel currents of the transistor models (60, 62) are equal. Once the junction voltages (64) are determined, the parameters of the transistor models (60, 62) are determined. Once the transistor models (60, 62) are determined, the models are combined to produce a composite transistor model (70) for the transistor using standard circuit reduction techniques. The composite model produced is scalable with respect to geometry, is continuous, and is differentiable. Steps are also disclosed for manufacturing integrated circuits using the modeling techniques of the present invention.

43 Claims, 17 Drawing Sheets

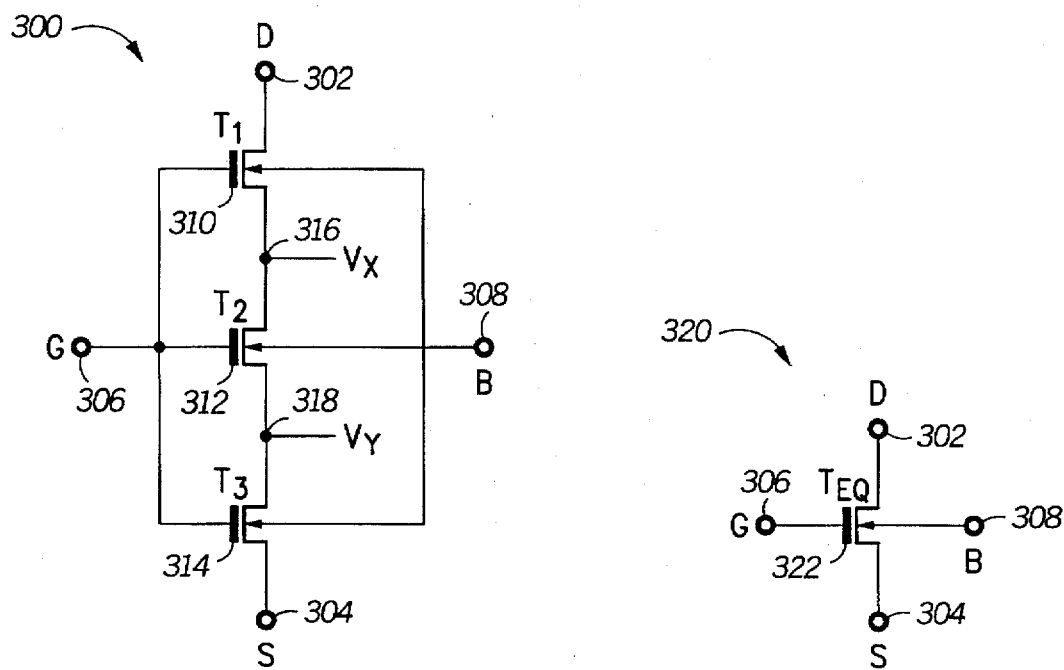
*FIG.17*    *FIG.18*
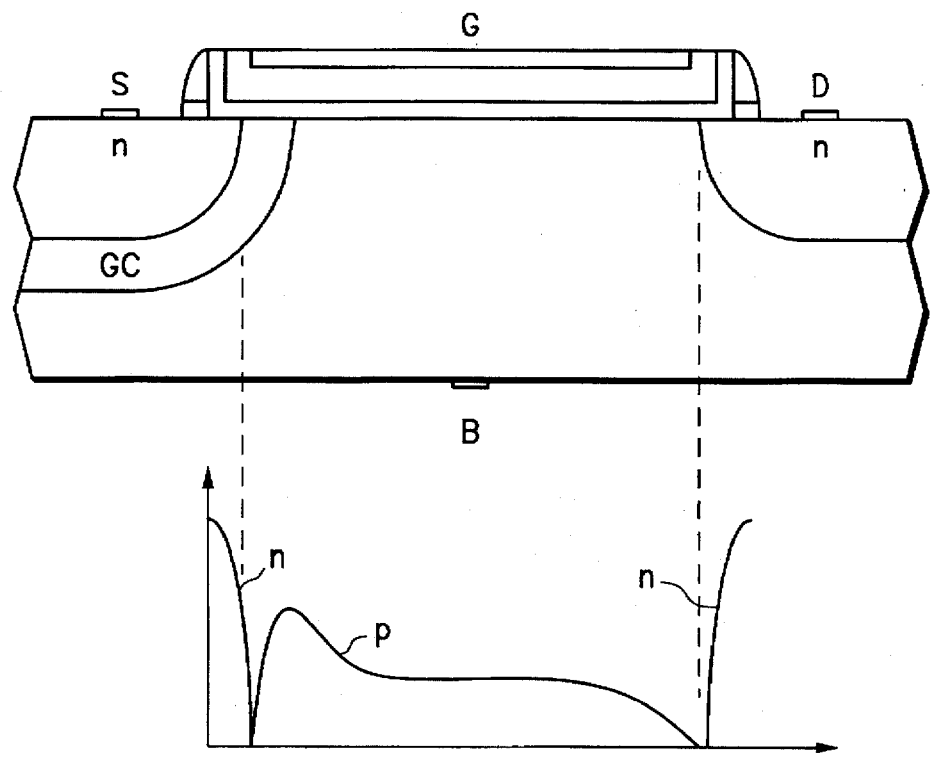
*FIG.19*
—PRIOR ART—

APPARATUS AND METHOD FOR MODELING A GRADED CHANNEL TRANSISTOR

TECHNICAL FIELD OF THE INVENTION

The present invention relates generally to the modeling of circuits and more specifically to a model for a graded channel MOS transistor and the development of the model.

BACKGROUND OF THE INVENTION

The modeling of circuit elements with computer equivalents has been known for many years. For many years, electrical circuit elements have been modeled using complex computer programs and equations. As technology has progressed, the computer modeling of complex and large integrated circuits has steadily progressed. Presently, many integrated circuits are computer modeled and simulated on high-powered digital computers so that the designs may be verified before they are manufactured. In many cases, the designs are altered based upon the results of the computer simulations.

As those skilled in the art will readily appreciate, transistor models have steadily evolved to aid the simulation of integrated circuits. Transistor models include those operating at different portions of the frequency spectrum, from the D.C. spectrum up to high frequencies. These models are used in conjunction with additional logic to verify the operation of integrated circuits. Standard transistor models to model conventional constant-doped channel region MOSFETs have been developed over the years and are used with various modeling and simulation tools. The standardized models may be ported between various modeling tools and are well understood by those skilled in the art.

Over the years, the size of individual transistors which make up integrated circuits has steadily decreased. While the decrease in size has allowed an increase in functionality of an integrated circuit of a particular size, problems result in the operation of the smaller circuit elements. For example, in the case of a MOS field effect transistor comprising a drain, a source, a gate, and a bulk substrate connection, smaller geometries results in a decrease in channel length between the source and drain. Given this reduction, punch-through of the channel region which results in unwanted parasitic current from the source to drain has become a problem. Thus, in order to prevent punch-through, it is desirable to increase doping of the channel region within the field effect transistor. However, with an increase in doping of the channel region, the mobility of the carriers within the channel region decreases, resulting in reduced drive current. Further, with the increase in doping, the gate voltage threshold that is required to turn the transistor on increases to unacceptable levels. This further reduces the drive current and may severely impact device speed. As those in the art appreciate, it is desirable to keep the threshold voltage as low as possible so that the transistor may most easily be turned on during a switching operation.

FIG. 1 illustrates a graded metal oxide semiconductor (GMOS) transistor as formed in an integrated circuit fabrication facility. FIG. 1 illustrates a gate electrode 406, a gate dielectric 408, N-type source and drain regions 400, a P region 402, and a P substrate 404 wherein the doping of the P region 402 is greater than the P-type substrate doping. The P region 402 is used to reduce E field problems in the transistor, reduce short channel problems, and correct threshold voltage (Vt) problems with transistors of a small size. As an example, the doping of the substrate may be $10^{15}$ boron atoms per cubic centimeter, whereas the doping of the region 402 is $10^{17}$ boron atoms per cubic centimeter. The change from $10^{17}$ atoms to $10^{15}$ atoms from the region 402 to the substrate 404 is not abrupt but is graded or changing gradually from $10^{17}$ to $10^{15}$, thus the term "graded junction", "graded MOSFET", or "GMOS." Modeling of this type of transistor has not been achieved with accuracy.

FIG. 2 illustrates another method for forming a GMOS device having a gate electrode 406, a gate dielectric 408, N-type source and drain regions 400, a P region 402, and a P substrate 404 wherein the doping of the P region 402 is greater than the P-type substrate doping as in FIG. 1. Modeling of this type of transistor has not been achieved with accuracy.

FIG. 3 illustrates another method for forming a GMOS device having a gate electrode 406, a gate dielectric 408, N-type source and drain regions 400, two P regions 402, and a P substrate 404 wherein the doping of the P region 402 is greater than the P-type substrate doping as in FIG. 1. Modeling of this type of transistor has not been achieved with accuracy.

To summarize, while the operation of the graded channel MOS device is understood in theory, the modeling of such has proven to be a difficult task. Most computer simulations to date have modeled the devices by averaging the values of the doping concentrations of regions 402 and substrate 404 over the respective channel lengths of FIGS. 1–3. These models are inherently inaccurate since they model a GMOS device as a conventional constant-doped channel device. These constant-doped channel device models do not reproduce many of the important physical and electrical intricacies of the actual GMOS device. In other words, if the graded channel MOS transistors could be modeled using a standard FET transistor model, the operation o,f the model would not illustrate the transconductance and total gate capacitance characteristics as the graded channel device exhibits as illustrated in FIGS. 5 and 6 herein. Thus, the usage of a standard FET model for the graded channel device would result in erroneous results. Because the physical design of integrated circuits utilizing the graded channel MOS devices is verified based upon a computer model, an erroneous computer model will not guarantee that the physical integrated circuit constructed will operate.

Thus, there is a need in the art for an improved GMOS circuit model and a method of deriving the same for accurately modeling a graded channel field effect transistor.

BRIEF DESCRIPTION OF THE DRAWINGS

FIG. 17 illustrates a schematic diagram of an intermediate model of a bilateral CMOS graded channel transistor;

FIG. 18 illustrates a schematic diagram of a composite model of the transistor illustrated in FIG. 13 and FIG. 14;

FIG. 19 illustrates in a cross sectional diagram one type of a GCMOS device as currently manufactured in the art;

DETAILED DESCRIPTION OF THE DRAWINGS

Figure 1:
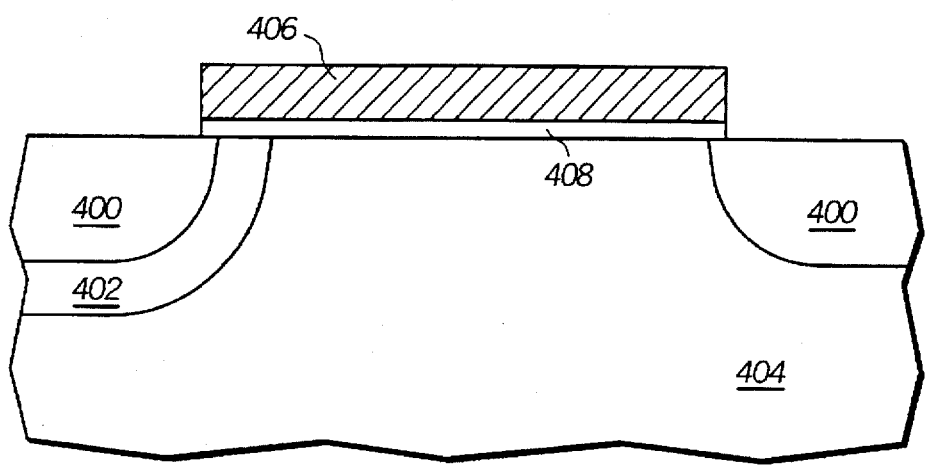
FIGS. 1–3 illustrates diagrammatic cross sections of known graded channel field effect transistors used in modern integrated circuit design.

In general, the present invention comprises a GMOS model and method of modeling a GMOS device which is very accurate. When this method or model is used to simulate an actual GMOS device, the method/model substantially reproduces all of the characteristics of the actual GMOS device. The actual GMOS devices of FIGS. 1–3 can be viewed as having two areas of constant doping concentrations with an interface that is substantially abrupt in terms of doping profile. This structure is shown in FIG. 4 and is labeled in accordance with FIGS. 1–3. Due to the constant-doped heavily-doped region 1 (analogous to regions 402 in FIGS. 1–3), the graded channel field effect transistor provides resistance to punch-through while the lower doped region allows for a low threshold voltage. Further, because the constant-doped lesser-doped region 2 of the channel region illustrated in FIG. 4 has a lower doping concentration than the first channel portion, the effective mobility of the total channel region is higher so that the drive current through the channel portion may be maintained during operation. As opposed to a field effect transistor having a uniformly and heavily doped channel region, the effective mobility of the channel of the graded channel transistor illustrated in FIG. 1 is greater. The advantages of this two region GMOS model is discussed further below.

Figure 5:
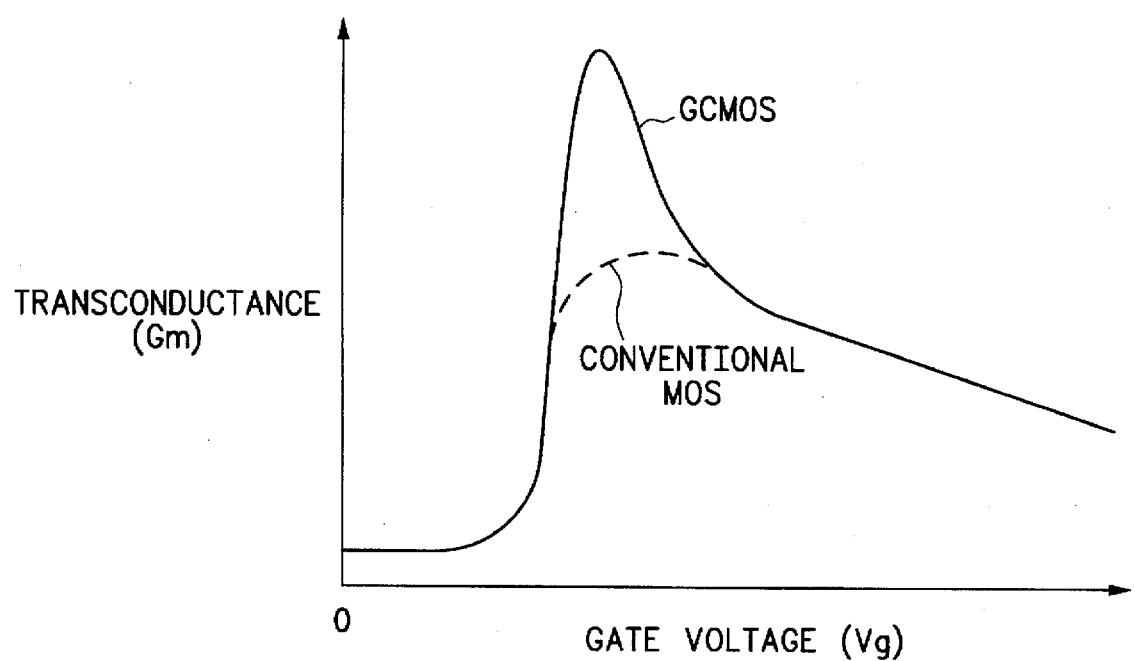
FIG. 5 illustrates a graph of a transconductance function of the graded channel MOS device with respect to gate voltage.

While the operational characteristics of the graded channel transistors have proven beneficial, the modeling of such transistors has been difficult. Modeling of the graded channel transistors has been difficult because the graded channel transistors have more complex operational characteristics than do standard field effect transistors. Referring to FIG. 5, the transconductance of a graded channel MOS field effect transistor (GCMOS) is compared to a conventional MOS device where the transconductance ($g_m$) versus gate voltage ($V_g$) is illustrated. As is shown, the transconductance of the graded channel MOS device has an exaggerated transconductance maximum wherein the conventional MOS device has a more rounded transconductance maximum. This difference in transconductance behavior is due to an inversion of the second channel portion prior to the inversion of the first channel portion during biasing of the gate. As will be readily appreciated by one skilled in the art, a conventional MOS device, having a uniform doping of the channel region, produces a smoother transconductance peak than does the graded channel MOS device. When modeling the GMOS device as a transistor having a single doping concentration averaged across the channel, the proper transconductance behavior of the GMOS device is lost in the simulation.

Figure 6:
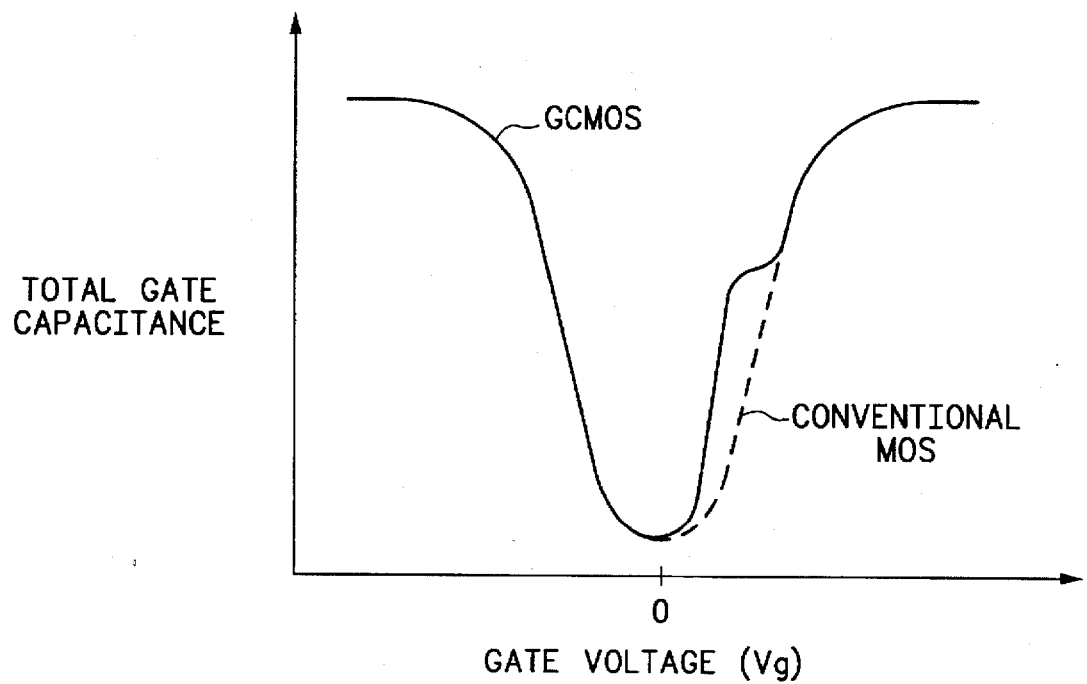
FIG. 6 illustrates a graph of the total gate capacitance of the graded channel MOS device with respect to gate voltage.

The total gate capacitance of the graded channel MOS device also differs from a conventional MOS device as a function of the gate voltage. As is illustrated in FIG. 6, a conventional MOS device illustrates a more rounded total gate capacitance characteristics as a function of gate voltage than does the graded channel MOS device. At around the zero gate voltage point for a typically-doped transistor, both the conventional MOS and graded channel MOS have a total gate capacitance minimum. However, as gate voltage is increased, the graded channel MOS device has a jog in the total gate capacitance due to the relatively earlier inversion of the second channel portion when compared to the first channel portion. Again, as with FIG. 5, the difference in behavior of the total gate capacitance of the graded channel MOS device is due to the earlier inversion of the second channel portion as compared to the first channel portion. When modeling the GMOS device as a transistor having a single doping concentration averaged across the channel, the proper capacitance behavior of the GMOS device is lost in the simulation.

The present invention can be further understood with reference to FIGS. 4–18. The present invention includes a method for modeling a graded channel transistor as well as the model created by such method.

In order to satisfy the various constraints present with smaller field effect transistors, it has been determined that developing a graded channel region is appropriate. With reference to FIG. 4, a graded channel region comprises a more highly doped portion represented as portion 1 and a lesser doped portion referred to as portion 2. As is shown in the illustration of FIG. 4, the length of the more highly doped portion 1 is represented by LGC. The effective length of the channel, designated as $L_{eff}$ is preferably more than twice the length of the more highly doped portion. As is known, it is desirable for the more highly doped portion of the channel to be less than the length of the lesser doped portion of the channel.

The method of the present invention includes assuming a uniform doping concentration of a first channel portion of the transistor and a uniform doping concentration of a second channel portion of the transistor as indicated in FIG. 4. The first channel portion 1 has a higher doping concentration than the second channel portion 2. Each of the channel portions is modeled using a standard transistor model with a junction voltage resulting between the two transistor models. In other words, each region 1 and 2 of FIG. 4 is modeled as an individual transistor which are connected in series. When connected in series, these two transistor models for region 1 and region 2 model the single GMOS transistor is a very accurate manner. A key to the two-transistor modeling of a single GMOS device is finding the junction voltage between the first transistor region 1 and the second transistor region 2 of the device of FIG. 4. The junction voltage is determined to be at a level such that the channel currents of both the first transistor model and the second transistor model are equal. Some more sophisticated models may factor in some slight substrate leakage or bulk affects. Once the junction voltage is determined, the parameters of both the first transistor model and the transistor model may be determined. Once all of the components of the first transistor model and the second transistor model are determined, the models may be combined to produce a composite transistor model for the entire GMOS transistor. In this fashion, the unique operating characteristics of the graded channel transistor illustrated in FIG. 5–6 are accurately simulated by the composite transistor model thus ensuring that an integrated circuit is accurately simulated.

Figure 7:
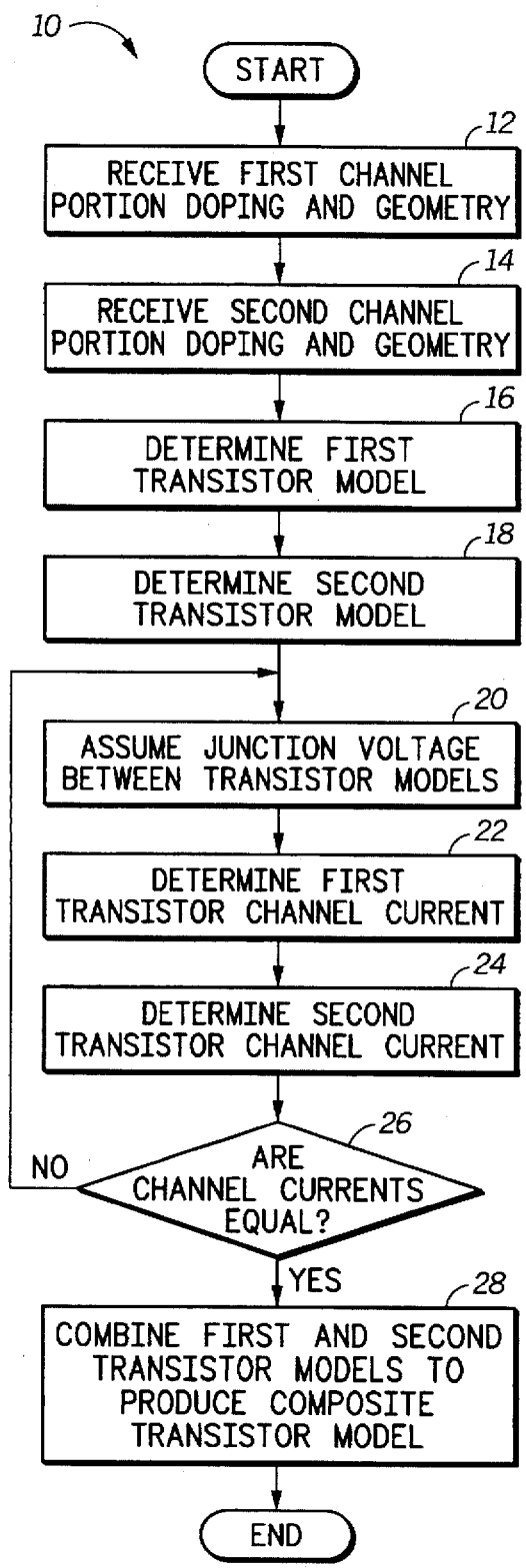
FIG. 7 illustrates a logic diagram of a method for modeling a graded channel transistor in accordance with the teachings of the present invention.

FIG. 7 illustrates a method 10 for modeling a transistor comprising a drain, a source, a gate, and a channel region. The channel region, as was previously illustrated in FIG. 1, comprises a first channel portion and a second channel portion. The first channel portion has a doping concentration greater than a doping concentration of the second channel portion and both portions are assumed for modeling purposes to have fixed/constant doping concentrations respectively.

The method 10 includes a first step 12 for receiving a geometry and a doping concentration of the first channel portion from memory. As one skilled in the art will readily appreciate, the method of the present invention is most readily practiced using a digital computer. Thus, the memory from which the information is received with respect to the first channel portion would be retrieved from memory by a processor contained within the digital computer. However, the practice of the method of the present invention is not limited to a digital computer but could be performed using some other processing device capable of performing mathematical operations, information retrievals, and information combinations. Examples of geometry and doping information is: doping of region 1 (first channel portion) is $10^{15}$; width of region 1 is 0.25 microns, length of region 1 is 0.08 microns, etc.

The method 10 includes a step 14 for receiving a geometry and a doping concentration of the second channel portion from memory. As was previously described, with respect to FIG. 1, the first channel portion has a higher doping concentration than the second channel portion and the first channel portion is preferably lesser in length than the second channel portion as illustrated in FIG. 4.

Figure 11:
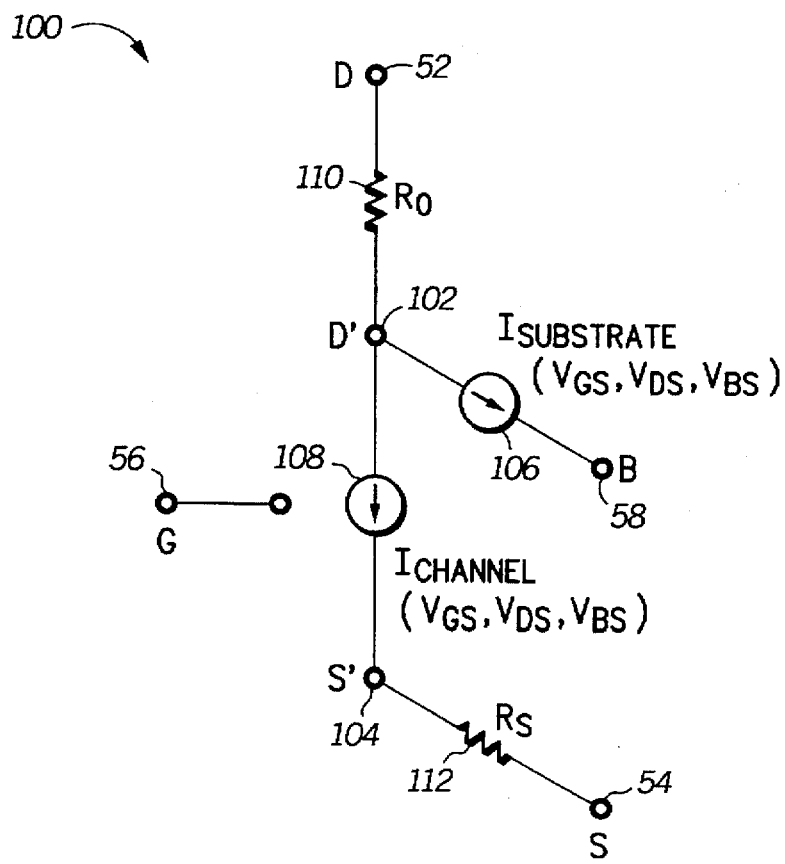
FIG. 11 illustrates a schematic diagram of a DC composite model of a graded channel transistor in accordance with the present invention.
Figure 12:
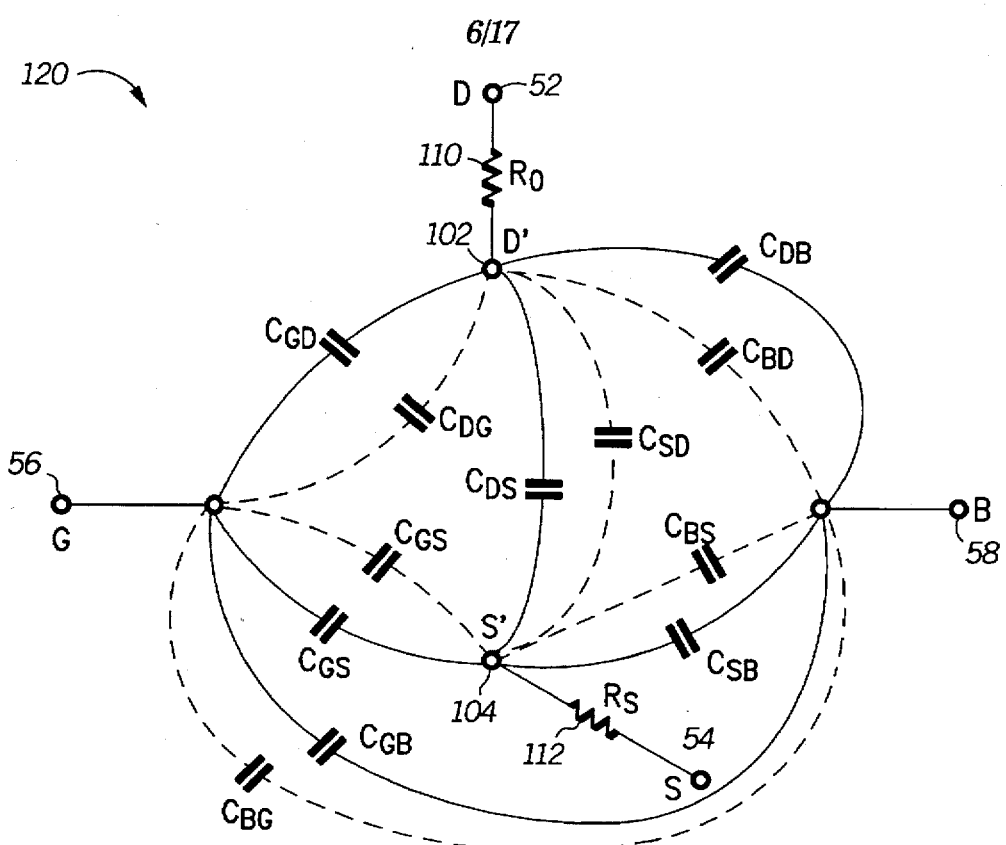
FIG. 12 illustrates a schematic diagram of a high frequency composite model of a graded channel transistor in accordance with the present invention.

Next, at step 16, the method 10 includes determining a first transistor model for the first channel portion. The first transistor model is based on the geometry and doping of the first channel portion. The first transistor model assumes a uniform doping concentration within the first channel portion. Preferably, a standard constant-doped channel region transistor model is used to model the first channel portion. Typical model parameters are illustrated in FIGS. 11 and 12 and discussed in detail later.

Next, at step 18, the method includes determining a second transistor model for the second channel portion. The second transistor model is based on the geometry and doping of the second channel portion and assumes a uniform doping concentration within the second channel portion. Thus, both the first transistor model and the second transistor model are constructed assuming uniform doping concentrations. Preferably, a standard constant-doped channel region transistor model is also used to model the second channel portion as well.

Next, at step 20, the method 10 includes assuming a junction voltage level at an interface between the first transistor model and the second transistor model. The first transistor model and the second transistor model are mathematically connected such that the source of the first transistor model connects to the drain of the second transistor model in series. The junction voltage is initially selected in a "best guess" manner wherein the initial voltage that is assumed lies numerically between the source voltage and drain voltage of the graded channel transistor. The value of the initial guess of the junction voltage is equal to a predetermined percentage of the range defined by the drain voltage and source voltage. If the initial guess is not correct, then the guessed value is refined in a manner analogous to a binary search or like convergence method so that the value is improved over time within the loop of steps 20 through 26.

A step 22 is used for determining a channel current of the first transistor model based on the junction voltage determined in step 20. The method of the present invention includes the assumption that the drain voltage and source voltage of the graded channel transistor is provided. Circuit modeling programs which incorporate the teachings of the present invention will provide such information to the present method. Thus, based on the assumed junction voltage level, the known drain voltage level and known source voltage level, the channel current of the first transistor model may be determined. Next, at step 24, based upon the junction voltage level from step 20, the drain voltage level, and the source voltage level, a channel current of the second transistor model is determined in similar manner to step 22.

Via step 26, the method 10 determines whether the channel current of the first transistor model equal the channel current of the second transistor model from the steps 22 and 24. Such a determination may be made simply by comparing the magnitude of the channel currents of each of the transistor models. As one skilled in the art will readily appreciate, the comparison between the channel currents may be made such that an affirmative result is obtained when only a small variance between the two current electrodes is determined.

If, at step 26, the channel currents of the first and second transistor models are not equal, the method 10 returns to step 20 wherein a new junction voltage level is assumed or determined between the transistor models. Such a new junction voltage is selected based upon the relative magnitudes of the channel currents in the transistor models in an attempt to equalize the channel currents in the transistor models. However, if at step 26, it is determined that the channel currents are equal, the method proceeds to step 28. Step 28 of the method 10 includes combining the first transistor model and the second transistor model to form a composite transistor model for the graded channel transistor.

Thus, the method 10 of the present invention has determined a composite model for a graded channel transistor. The composite model may then be used in conjunction with other circuit simulation tools in order to verify the operation of GMOS-containing integrated circuitry prior to its manufacture. Based upon the composite model, it may be determined that the circuit has to be altered in order to guarantee its correct operation. Because the composite circuit model takes into consideration and accurately models the variances in the transconductance and total gate capacitance of the device, it is ensured that the modeling of integrated circuitry containing such graded transistors is accurate. Thus, the present method provides the important benefit not previously realized of accurately modeling the operation of a graded channel field effect transistor.

Preferably, the method 10 includes steps resulting in the forming of a composite transistor model that has a continuous charge and current functions. Further, the method preferably produces a composite transistor model whose charge and current functions are differentiable so that the model may operate with standard circuit simulators. Thus, the method 10 may include steps for determining derivative functions of the composite transistor model with such derivative functions available for use in conjunction with the standard circuit simulators. In addition, the model may be made so that the model is scalable for different sized devices. In other words, if one models a GMOS transistor as having a channel width=1 micron and a channel length=0.8 microns, the model can be easily converted via conversion calculations if the size of this GMOS transistor were to change, for example, to a channel width=0.5 microns and a channel length=0.6 microns.

Figure 8:
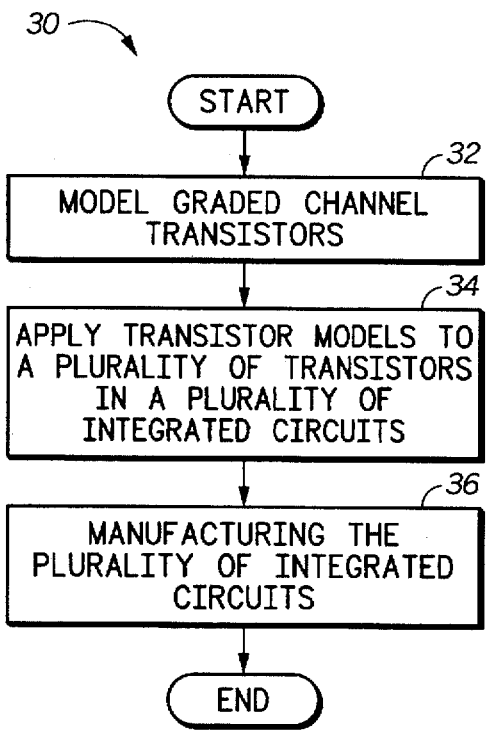
FIG. 8 illustrates a logic diagram of a method for manufacturing a plurality of integrated circuits including a plurality of graded channel transistors in accordance with the present invention.

FIG. 8 illustrates a method 30 for manufacturing a plurality of integrated circuits wherein at least some of these integrated circuits comprise graded channel transistors. The method 30 includes as a first step 32 modeling the individual graded channel transistors as taught above via FIG. 7. Step 32 preferably includes each of the steps included in the method 10 illustrated in FIG. 4. Thus, step 32 produces a composite model for each of the plurality of transistors in the design file. Preferably, step 32 produces a design file that includes the plurality of graded channel transistors models using the composite transistor model.

Next, at step 34, the method 30 includes applying the transistor models generated in step 32 to a plurality of transistors that make up one or more integrated circuits. Thus, the transistor models accurately represent the actual physical and electrical operation of graded channel transistors within the integrated circuit. Next, at step 36, the method 30 includes manufacturing the plurality of integrated circuits on a substrate. The plurality of integrated circuits are constructed containing the plurality of transistors which comprise the graded channel transistors. The manufacture of integrated circuits on a substrate, some of which include manufacturing graded channel transistors, is known in the art and taught via Silicon Processing for the VLSI Era, Vol. 1—Process Technology, by Wolf and Tauber, published by Lattice Press, Copyright 1986.

In summary, the method illustrated in FIG. 8 allows for the manufacture of a plurality of integrated circuits on a substrate wherein graded channel transistors manufactured on the substrate have been modeled using the teachings of the present invention. The steps required by the method 30 of FIG. 8 allows for the accurate modeling of the operation of the integrated circuits prior to their manufacture, which is not possible given the prior modeling techniques of GMOS devices.

Preferably, the composite transistor model for the graded channel transistor is scalable with respect to a geometry of the transistor. Thus, with the composite transistor model scalable with respect to a geometry of the transistor, each of the circuit parameters generated by the method of the present invention may be altered to represent a new geometry of the transistors simply by scaling the parameters. The scalable nature of the parameters is particularly helpful when the physical design of a graded channel transistor is altered as may be required to ensure the operation of an integrated circuit in which the transistor resides. Preferably, the transistor model is scalable both with respect to the length of the transistor and with respect to the width of the transistor. Preferably, the composite model is also scalable with respect to a gate voltage applied to the transistor. The scalability with respect to the gate voltage is advantageous for integrated circuits (ICs) that may receive more than one power supply, or ICs that progress in voltage from high voltages to low voltages over redesign cycles that occur over time. Also, such scalability may be required when modeling different modes of operation of the integrated circuit in which the graded channel transistors reside.

The methods illustrated in FIG. 7 and FIG. 8 preferably are applicable to any of a variety of field effect transistors, the variety including metal oxide silicon field effect transistors, bi-lateral metal oxide silicon field effect transistors, as well as any other variety of field effect transistors. Thus, the modeling illustrated in the present invention may be used in conjunction with any of a variety of field effect transistors.

Figure 9:
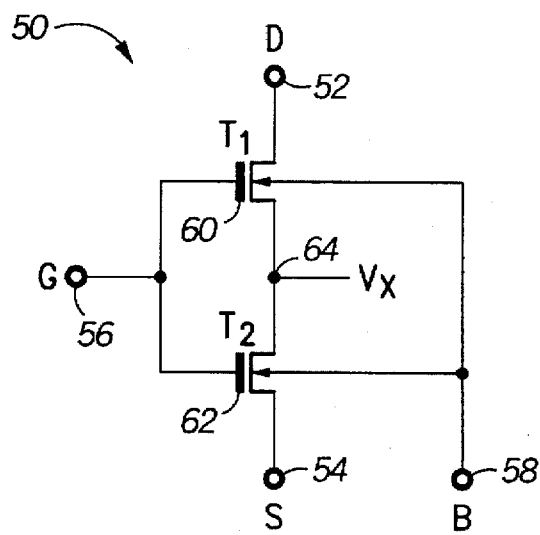
FIG. 9 illustrates a schematic diagram of an intermediary model of a graded channel transistor in accordance with the present invention.
Figure 10:
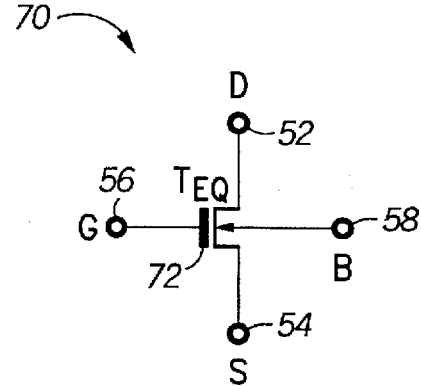
FIG. 10 illustrates a schematic diagram of a composite model of a graded channel transistor in accordance with the present invention.

FIGS. 9 and 10 in combination illustrate transistor models representing a transistor comprising a drain, a source, a gate, and a channel region. The channel region comprises the first channel portion and a second channel portion wherein the first channel portion has a doping concentration greater than a doping concentration of the second channel portion. With specific reference to FIG. 9, the model 50 includes a first transistor model 60, and a second transistor model 62. The first transistor model 60 represents the first channel portion of a GMOS device and assumes a first uniform doping concentration of the first channel portion. The first transistor model 60 connects to the drain 52, a gate 56, and a junction voltage point 64. The junction point 64 is a fictitious physical junction location that is between the region 1 and region 2 of FIG. 4. The junction 64 is assumed to have a junction voltage ($V_x$) for the purposes discussed in FIG. 8. In reality, the region 64 of FIG. 9 is not a source coupled to a drain as normal transistor would be coupled in a typical inverter-type structure, but a thin junction interface region between regions 1 and 2 of FIG. 4.

The second transistor model 62 operably couples to the first transistor model 60 at the junction voltage point 64, and the gate 56. The second transistor model 62 includes a source connection 54 which is the source connection of the GMOS transistor. Both the first transistor model 60 and second transistor model 62 include a bulk connection 58. The second transistor model represents the second channel portion and assumes a second uniform doping concentration of the second channel portion different from the doping concentration of the first channel portion. As was previously described, the doping concentration of the second channel portion is typically less than the doping concentration of the first channel portion.

The modeled junction voltage $V_x$ of region 64 between the first transistor model 60 and the second transistor model 62 is determined such that the first transistor model 60 and the second transistor model 62 have equal channel currents. As was previously described with respect to the method of FIG. 7, an iterative solution is determined for the modeled junction voltage $V_x$ of region 64 to result in the current between drain 52 and region 64 being equal to the current between source 54 and the region 64. Further, as was previously discussed, the voltages at the drain 52 and the source 54 are provided by a modeling program in which the graded channel transistor is modeled.

Thus, the graded channel field effect transistor having a channel region with two channel portions of different doping is modeled using two separate transistor models in accordance with the present invention. The differing transistor models allow for differing inversion characteristics of the channel portions having the differing doping concentrations. Thus, the transconductance and capacitance characteristics of the graded channel transistor are more accurately modeled than the prior art.

FIG. 10 illustrates a composite transistor model 70 constructed based upon the first transistor model 60 and the second transistor 62 of FIG. 6. The composite transistor model comprises a single transistor equivalent 72. The connections of the single transistor model 72 are made to the drain 52, the source 54, the gate 56, and the bulk 58. The composite transistor model 70 is derived by creating an equivalent circuit of the mathematical modeling of the first transistor model 60 and the second transistor model 62. Standard circuit reduction techniques are employed to create the composite transistor model 70 from the transistors 60 and 62 of FIG. 9.

FIG. 11 illustrates a schematic diagram of a composite transistor model 100 operating under DC conditions. As one skilled in the art will readily appreciate, the model illustrated in FIG. 11 is based upon standard circuit parameters and standard modeling criterion for field effect transistors. As is shown, the model 100 comprises connections at the drain 52, the source 54, the gate 56, and the bulk 58. The model 100 also includes internal connections D' 102 and S' 104. Resistive element $R_d$ 110 connects between the drain 52 and the internal connection D' 102. Source resistance $R_s$ 112 connects between the source connection 54 and the internal source connection S' 104. Internal drain connection D' 102 connects with the internal source connection S' 104 through a current source 108 represented as $I_{channel}$. The current source 108 produces a current that is a function of: (1) the voltage from the gate to the source ($V_{gs}$); (2) The voltage from the drain to the source ($V_{ds}$); and (3) the voltage from the bulk to the source ($V_{bs}$). Current source $I_{substrate}$ 106 connects the internal drain connection D' 102 with the bulk 58 and is typically used to illustrate bulk leakage current. $I_{substrate}$ is also a function of $V_{gs}$, $V_{ds}$, and $V_{bs}$. As one skilled in the art will readily appreciate, the function of both $I_{channel}$ and $I_{substrate}$ are non-linear and continuously differentiable.

Thus, the DC model 100 of FIG. 11 allows the circuit designer to model the graded channel field effect transistor during a DC operating condition. The DC model 100 guarantees an accurate representation of the graded channel FET during DC operations. As one skilled in the art will readily appreciate, there are also diode effects with respect to the graded channel transistor. Because of the relative doping of the drain 52, the source 54, and the bulk 58, there will be PN junctions between the drain 52 and the base 58 as well as between the source 54 to the bulk 58. Typically, these diode effects are not considered within the transistor model but are represented by additional circuit elements external to the transistor models. Thus, FIG. 8 does not illustrate the diode effects that are otherwise compensated for by the additional circuit elements.

FIG. 12 illustrates a circuit model 120 for a graded channel transistor that has only the capacitive elements of the model. As one skilled in the art will readily appreciate, the high frequency model of the graded channel transistor will include all of the capacitive elements as illustrated in FIG. 12 as well as the DC elements illustrated in FIG. 11. With reference to only FIG. 12, between the internal drain connection D' 102, internal source connection S' 104, gate 56, and bulk 58, are a plurality of capacitive elements. As one skilled in the art will readily appreciate, there are capacitances between each of the connections of the transistor model. Further, as one skilled in the art will readily appreciate, between each of the nodes of the transistor model, there are two equivalent capacitances. For example, between internal drain connection D' 102 and internal source connection S' 104 there is a first capacitive elements $C_{ds}$ and a second capacitive elements $C_{sd}$. These two capacitive elements are not necessarily equal because a variation in the voltage of either the internal drain connection D' 102 or internal source node S' 104 will vary the magnitude of the capacitive elements. Thus, the capacitance between the connections 102 and 104 must be modeled with separate capacitive elements. Each of the capacitive elements of the circuit model 120 are functions of $V_{gs}$, $V_{ds}$ and $V_{bs}$. As one skilled in the art will readily appreciate these functions are typically non-linear but are differentiable with respect to $V_{gs}$, $V_{ds}$, and $V_{bs}$.

Therefore, the circuit model 120 illustrated in FIG. 12 may be applied to the graded channel transistors within a circuit to accurately represent the operation of the graded channel transistors. Further, because the circuit elements within the model 120 are described with respect to the parameters therein, the circuit model 120 may be input into a larger modeling program that may consider a vast number of graded channel transistors. Given this fact, one can easily see that the errors in GMOS modeling inherent in the prior art can accumulate over several devices so that a small modeling inconsistency in one GMOS device becomes a huge error when aggregated over thousands or millions of devices.

Figure 13:
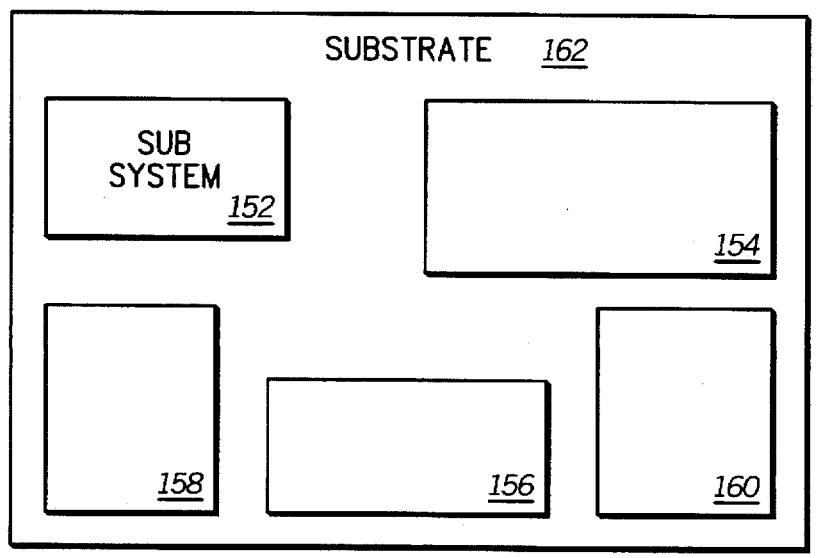
FIG. 13 illustrates a block diagram of an integrated circuit constructed using the modeling techniques disclosed in accordance with the present invention.

FIG. 13 illustrates a block diagram of an integrated circuit 150 comprising a plurality of transistors. At least a portion of the plurality of transistors comprise graded channel transistors wherein each of the graded transistors have a drain, a source, a gate and a channel region. Each of the channel regions of the plurality of graded channel transistors comprise a first channel portion and a second channel portion. The first channel portion has a doping concentration greater than the second channel portion. The integrated circuit 150 preferably comprises a plurality of subsystems, represented as 152, 154, 156, 158, and 160. These subsystems preferably are laid out on a single substrate 162. These subsystems will include a number of circuits within each subsystem. The integrated circuits in turn will include the plurality of graded channel transistors.

Each of the graded channel transistors within the graded circuit 150 is represented by a composite transistor model when simulated before manufacture. The composite transistor model has been constructed in accordance with the teachings of the present invention such that a first transistor model represents the first channel portion and a second transistor model represents the second channel portion. The first transistor model and the second transistor model have been created such that they have equal channel currents when bulk leakage is assumed to be nonexistent. The first transistor model and the second transistor model have then been combined to perform the composite transistor model for each of the graded channel transistors of the integrated circuit 150.

Thus, an integrated circuit 150 may be constructed based upon the teachings of the present invention with respect to the modeling of the graded channel transistors. In this fashion, an integrated circuit 150 may be modeled using the teachings of the present invention prior to its construction to guarantee the operation of the integrated circuit 150.

Figure 14:
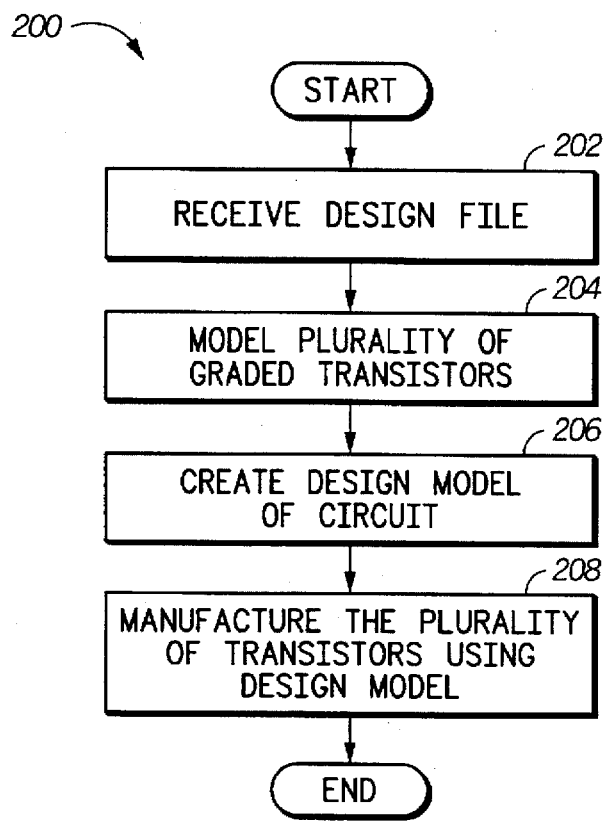
FIG. 14 illustrates a logic diagram of a method of manufacturing a plurality of transistors in accordance with the teachings of the present invention.

FIG. 14 illustrates a method 200 for manufacturing a plurality of integrated circuits. The method 200 includes receiving a design file via a first step 202. Preferably, the design file includes the location and construction of a plurality of transistors within a plurality of integrated circuits. The design file may then be used in conjunction with step 204 to model the plurality of graded channel transistors. The modeling of the graded channel transistors is performed in accordance with the present invention as has been previously described with respect to method 10. Thus, the details of step 204 of FIG. 14 are not further described herein with respect to FIG. 14. Next, at step 206, the method 200 includes creating a design model of the integrated circuits based upon the models created in step 204. In accordance with step 206, the plurality of graded channel transistors are interoperably coupled to operate as one integrated circuit among the plurality of integrated circuits. The plurality of integrated circuits may further operate in conjunction with one another to achieve a design goal. Next, at step 208, the method 200 includes manufacturing the plurality of integrated circuits in accordance with the design model of the circuit created in step 206. Because the requirements of manufacturing the plurality of integrated circuits in accordance with the design model are known in the art and are not germane to the present invention, these steps are not further described herein.

Figure 2:
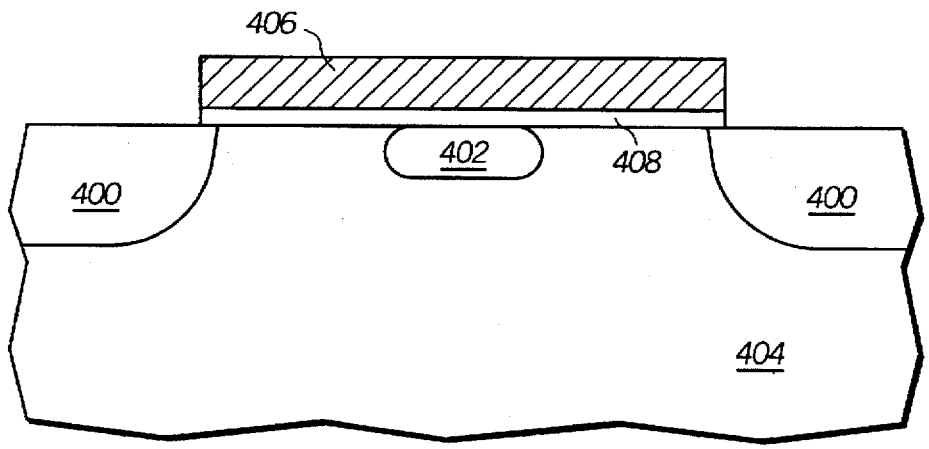
Figure 3:
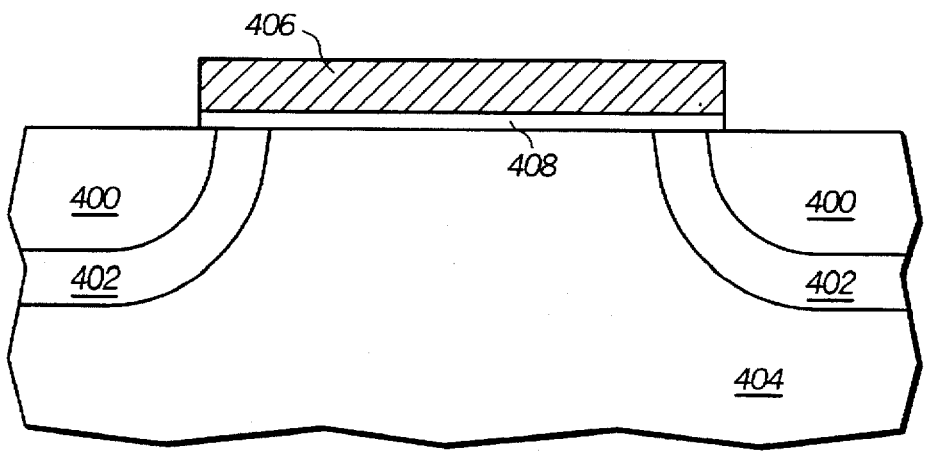
Figure 4:
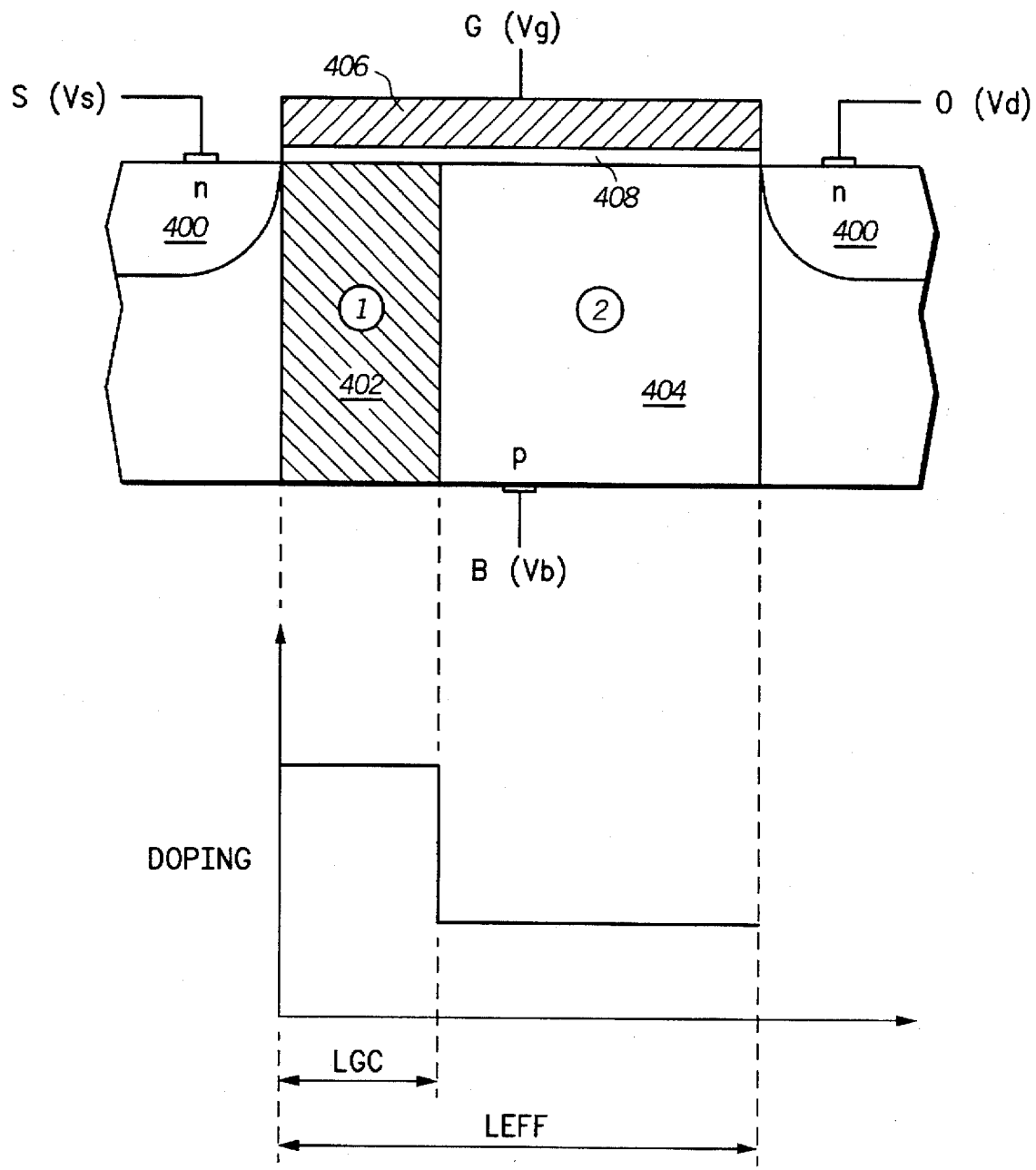
FIG. 4 illustrates, in a diagrammatic cross section, a model which profiles the doping concentration of the graded channel of a graded channel field effect transistor in accordance with the present invention.
Figure 15:
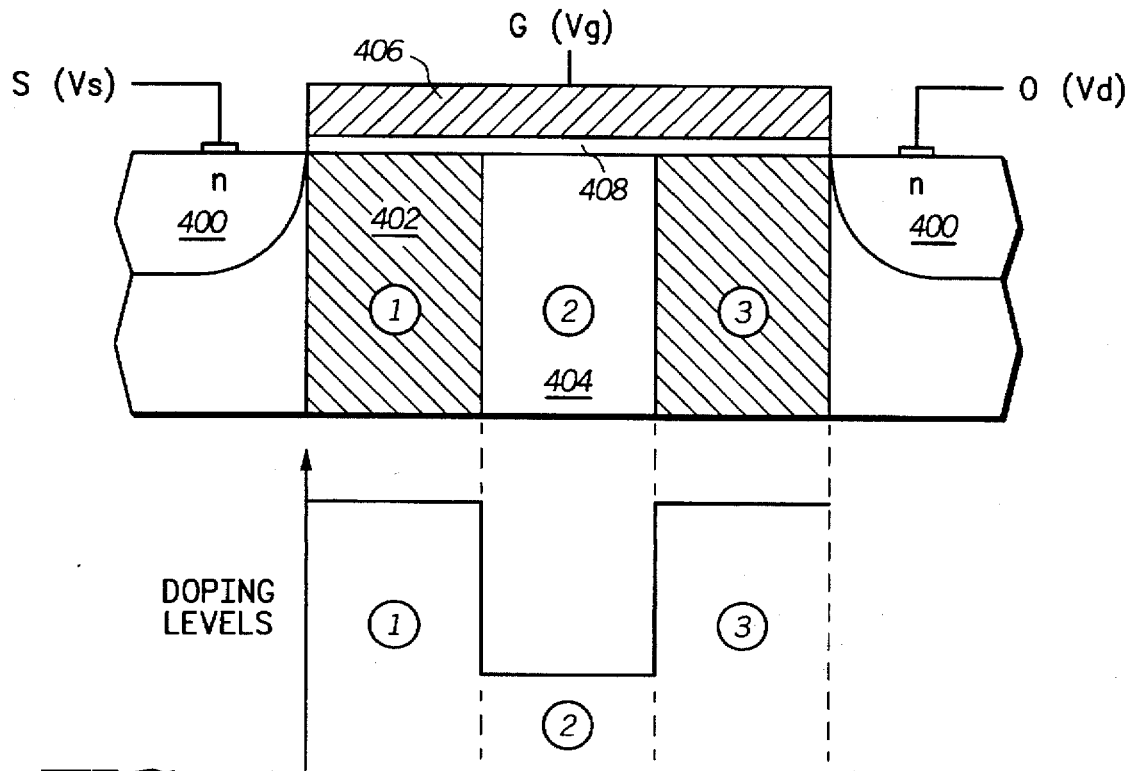
FIG. 15 illustrates a diagrammatic cross section of a prior art graded channel transistor having two highly doped channel regions and one lesser doped channel region.

FIG. 15 illustrates a graded channel model transistor having three separate channel portions to model the GMOS embodiment of FIG. 3. The first channel portion and the third channel portion have relatively higher doping concentration than does the second channel portion. As those skilled in the art will readily appreciate, the construction of the graded channel transistor illustrated in FIG. 12 produces enhanced benefits with respect to threshold voltages, punch-through resistance, and current drive. In addition, FIG. 15 may be used to model the embodiment illustrated in FIG. 2 if the region 2 of FIG. 15 is of a higher doping concentration than regions 1 and 3 of FIG. 15. Therefore, it should be appreciated that any GMOS transistor can be modeled given the methods and models taught herein, and that the modeling can involve more than the two transistors illustrated in FIG. 9. For example, if a GMOS transistor is formed having three different doping concentrations in three different channel portions, then three transistors will be used instead of two.

Figure 16:
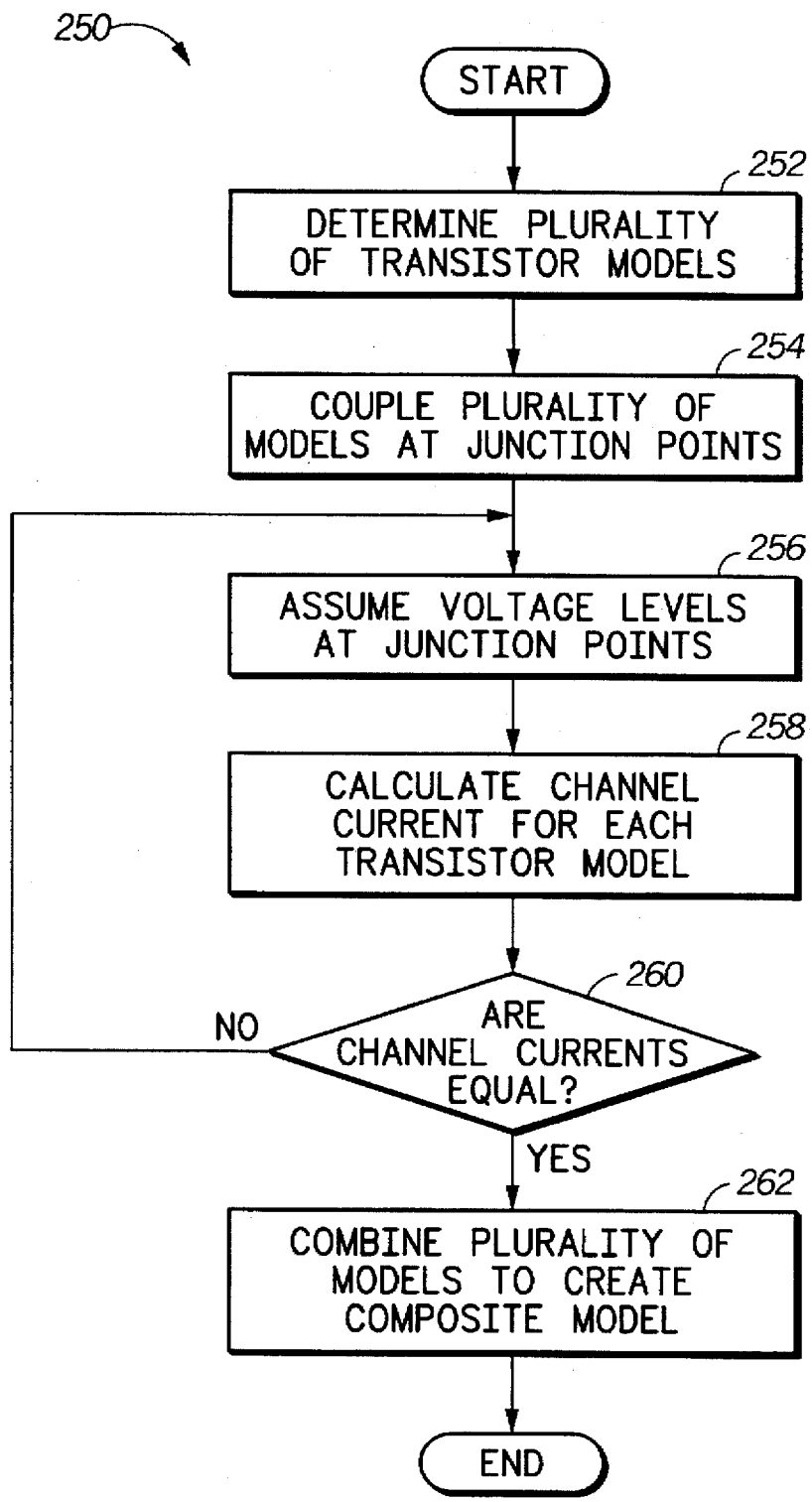
FIG. 16 illustrates a logic diagram of a method for modeling a graded channel transistor having a plurality of channel regions of varying doping concentrations.

FIG. 16 illustrates a method for creating a model of a graded channel transistor having a plurality of channel portions of varying doping concentrations such as the transistors illustrated in FIG. 2 and FIG. 3. The method 250 includes as a first step 252 determining a plurality of transistor models. Each of the plurality of transistor models represents a portion of the channel of the transistor. Each of the plurality of transistor models assumes a uniform doping concentration of a respective channel portion. With specific reference to the circuit of FIG. 12, three separate transistor models would be determined. The first transistor model would present channel region one and assume the doping concentration of channel region one. The second transistor model would represent channel region two and assume the doping concentration of channel region two. Finally, the transistor model representing channel region three would assume the doping concentration of channel region three. In another form, if the doping concentration of the first and third regions are substantially equal, these two regions may be lumped together into one transistor model in FIG. 9 wherein the length of this one transistor model is the sum of the lengths of the first and third channel portions.

Referring again to FIG. 16, the method 250 includes at step 254 coupling the plurality of transistor models such that respective junction voltage levels reside between the adjacent transistor models. As was previously described, the drain and source voltage levels of the graded transistor are known and are provided for use in conjunction with the present invention.

Next, at step 256, the method 250 includes assuming voltage levels at each of the junctions of the plurality of transistor models. Next, at step 258, the method includes calculating the channel current of each of the plurality of transistor models based on the respected junction voltage levels, the drain voltage, and the source voltage. Next, at decision step 260, it is determined whether or not the channel currents of the plurality of transistor models are equal. If the currents are not equal, the method proceeds from step 260 again to step 256 wherein voltage levels are assumed differently. As one skilled in the art will readily appreciate, the iterative process required to determine the voltage levels of the junction points may be accomplished in any of a variety of manners.

If, at step 260, it is determined that the channel currents of the plurality of transistor models are equal, the method proceeds to step 262 wherein the plurality of transistor models are combined to create a composite model of the graded channel transistor.

FIG. 17 and FIG. 18 illustrate the construction of an equivalent transistor model for a graded transistor having three channel regions as illustrated in FIG. 12. FIG. 17 illustrates a transistor model 300 comprising a first transistor model T1 310, a second transistor model T2 312, and a third transistor model T3 314. The three transistor models of FIG. 17 are connected between a drain connection 302, a source connection 304, a gate connections 306, and a bulk connection 308. Between the first transistor model 310 and the second transistor 312 is a junction point 316 having a junction voltage $V_x$. Between the second transistor model 312 and the third transistor model 314, is a junction point 318 having a junction voltage $V_y$. In accordance with the present invention, the junction voltage $V_x$ at junction point 316 and the junction voltage $V_y$ at junction point 318 are calculated using the iterative approach until the channel currents of the three transistor models T1, T2, and T3 are equal.

Then, with reference to FIG. 15, an equivalent transistor model 210 is determined based upon the individual transistor model 310, 312, and 314 and the junction voltage levels $V_x$ and $V_y$. As was previously discussed, the equivalent transistor model 320 includes an equivalent transistor 322 having connections to the drain 302, the source 304, the gate 306, and the base 308. Standard circuit element manipulations techniques are used to determine the equivalent graded channel transistor model 320.

Thus, the teachings illustrated with reference to FIG. 14 through FIG. 18 may be applied to graded channel transistors having any number of channel portions of varying doping concentrations. The equivalent transistor model produced by the methodology of the present invention may, therefore, be applied in order to more thoroughly and accurately model the graded channel transistors.

The above described preferred embodiments are intended to illustrate the principles of the invention, but not to limit the scope of the invention. Various other embodiments and modifications to these preferred embodiments may be made by those skilled in the art without departing from the scope of the following claims.

In-Depth Detailed Technical Description

1. Introduction

It has been found that GCMOS devices have several electrical characteristics that are difficult to replicate using conventional tools. For example, the transconductance of GCMOS-FETs plotted as a function of the gate voltage shows a "spike" around the threshold point. In conventional MOSFETs the transconductance increases smoothly as the gate voltage increases. As another example, if the source and drain terminals are interchanged in a GCMOS device while keeping the external biases fixed, the channel current changes. Conventional MOSFETs, on the other hand, are "symmetric" insofar as their source and drain terminals may be interchanged with no change in current. These effects arise fundamentally from the laterally non-uniform channel doping in GCMOS structures. Since conventional tools are based on the assumption of a laterally uniform channel doping profile, it is easy to see the resulting difficulties in replicating GCMOS characteristics using this uniform-doping model. Some discussion of models for GCMOS-like structures is available in the external literature, but these reports are not comprehensive, being limited mainly to analyses of the threshold voltage. See Y. Okumura, M. Shirahata, A. Hachisuka, T. Okudaira, H. Arima, and T. Matsukawa, "Source-to-Drain Nonuniformly Doped Channel MOSFET Structures for High Current Drivability and Threshold Voltage Controllability," IEEE *Trans. Electron Dev.*, vol. 39, p. 2541, 1992; A. Wild and J. Buxo, "A Quasi-Bidimensional Description of the Threshold Voltage in MOS Transistors," presented at the *Technical Enrichment Matrix*, 1993; C. L. Wang, "Modeling of Channel Current and Threshold Voltage of Non-uniformly Doped Channel MOSFETs,"presented at the *Technical Enrichment Matrix*, 1993. A new MOSFET model described herein, called the Graded Channel IGFET Model (GCIM), has been developed that accurately reproduces all peculiarities observed in the electrical behavior of GCMOS devices unlike conventional models. The model has been implemented in MCSPICE and may be available using other tools. The GCIM model is basically an improved transistor model that allows the inclusion of a laterally non-uniform channel doping profile through the use of eight novel model parameters. In its current form, the GCIM model is fully backward compatible to conventional uniform doping models and, as such, retains all of the advantages offered by conventional tools while also better simulating GCMOS devices.

In the following sections several aspects of GCIM are described. In Section 2 the significant differences in electrical behavior between GCMOS devices and conventional MOSFETs are presented. Theoretical aspects of the GCIM model are discussed in Section 3. Comparisons with experimentally measured data are provided in Section 4 to validate the accuracy of the model. In Section 5 the implementation of the model in MCSPICE is discussed. Note that all of the measured data presented below in this potion of the description were obtained from devices fabricated using current GCMOS processing.

2. GCMOS Electrical Characteristics

In this section the main differences between GCMOS transistors and conventional MOSFETs are highlighted. FIG. 19 is a cross-sectional representation of an n-channel GCMOS transistor. The main distinguishing feature of this device is the region marked GC adjacent to the source. This region is produced by ion-implantation of dopants of the same type as the substrate and is characterized by its higher doping, relative to the rest of the substrate. A representative profile along the channel of a GCMOS device in the lateral direction (x) is shown at the bottom of FIG. 19. It should be clear that this GC region is responsible for the lateral non-uniformity in channel doping, and hence the electrical peculiarities of GCMOS devices.

Figure 20:
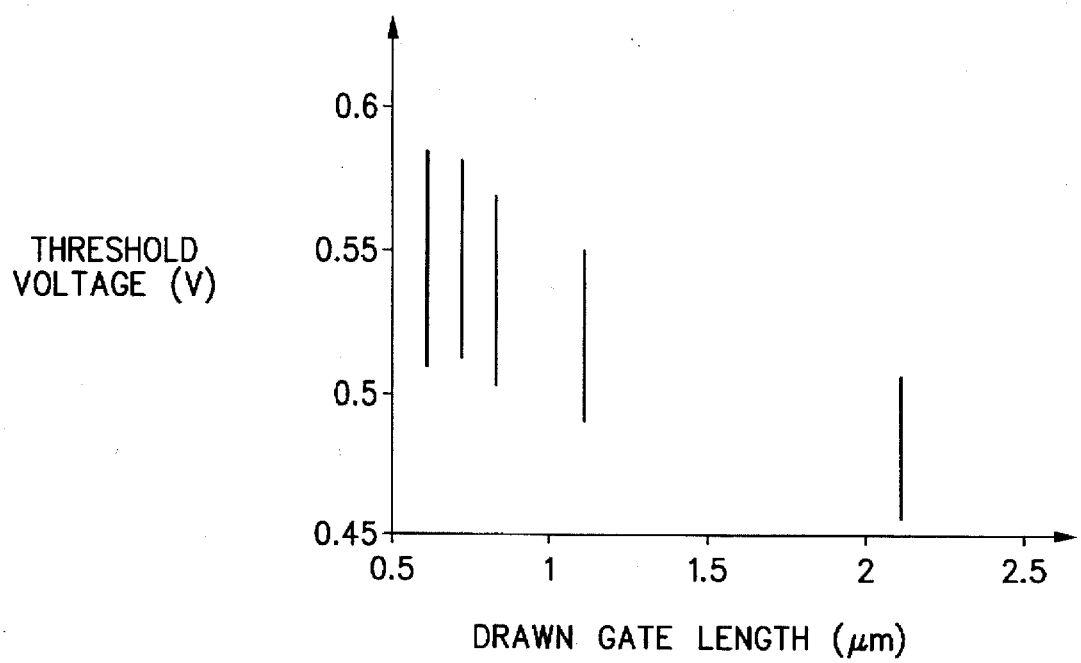
FIG. 20 illustrates, in an XY plot, threshold voltage versus gate length for a GCMOS device in accordance with the present invention.

The nature of threshold voltage scaling in GCMOS devices is first considered. FIG. 20 is a plot of threshold voltage, $V_{th}$, versus gate length measured on a GCMOS device such as the device of FIG. 19. FIG. 20 illustrates a measurement of variation of threshold voltage as a function of drawn gate length in n-channel GCMOS devices. In conventional MOSFETs the threshold voltage drops as the channel length is reduced contrary to the GMOS device measured to get the data for FIG. 20. This is due to the fact that as gate length is reduced physically while thermal cycles and doping diffusion coefficients remain the same, the region GC becomes a larger portion of the channel region and higher doped channels invert at higher $V_{th}$ values.

Figure 21:
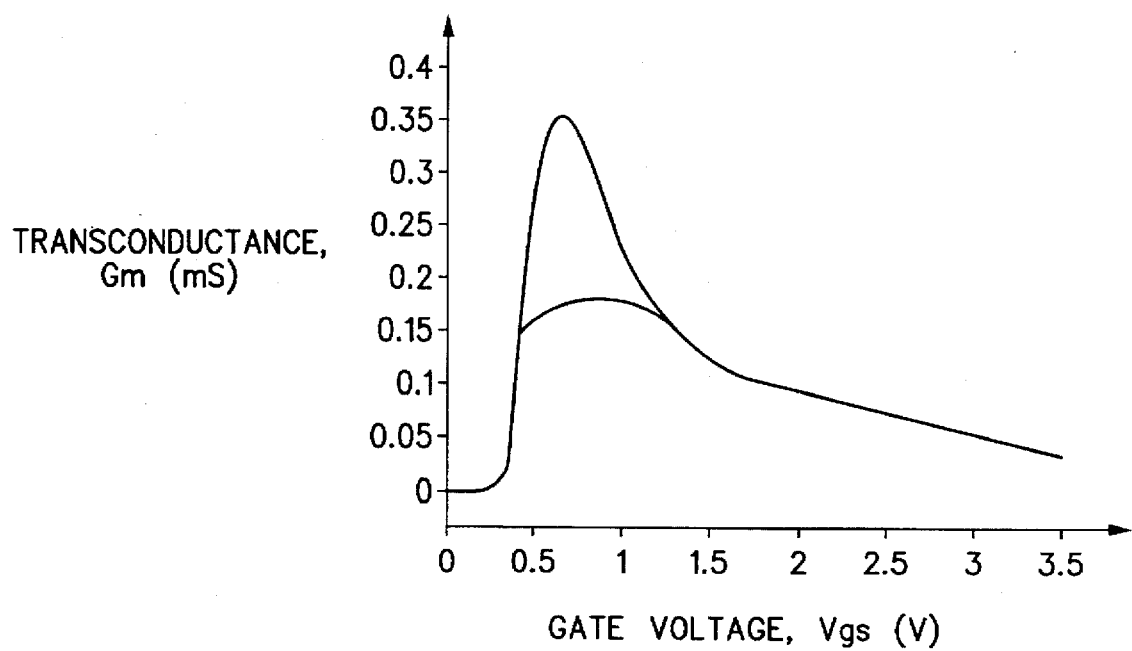
FIG. 21 illustrates, in an XY plot, transconductance versus gate voltage for a GCMOS device as compared to a conventional CMOS device in accordance with the present invention.

Another GCMOS characteristic lies in the nature of its transconductance ($g_m$) variation with gate voltage (Vgs). FIG. 21 shows a $g_m$ versus $V_{gs}$ plot measured on an actual GMOS device with a drawn W/L ratio of 24/2 microns and biased in the linear region of operation. The spike-like shape at turn on is characteristic of GCMOS devices and is absent in conventional MOS uniform-doped channels. In FIG. 21, it can be seen that as $V_{gs}$ is increased and the device turns on, there is a very sharp "spike"when $g_m$ reaches its peak value. As $V_{gs}$ is further increased, $g_m$ decreases due to the classical mobility degradation effect. A qualitative explanation of the spike in $g_m$ is as follows. As the gate voltage on the device is increased, the portion of the channel outside the GC region is first inverted. At this point, the GC region itself, being highly doped, is not inverted and very little current is conducted by the device. Thus the non-GC region can be viewed as an extension of the drain and the effective channel length of the device is the "length" of the un-inverted GC region under the gate. Typically this "length"is small compared to the total channel length of the device. As Vgs is increased further the GC region also begins to invert but because the effective channel length of the device is small, the transconductance during this phase is high. With further increase in $V_{gs}$ the channel is entirely inverted and its effective length becomes equal to the total channel length of the structure, resulting in a decrease in transconductance. It should be noted that in conventional MOSFETs the linear region $g_m$ also increases with $V_{gs}$ until it reaches a peak value and then begins to decrease. But in these devices the transition through the peak point is much smoother with no spike-like feature.

Figure 22:
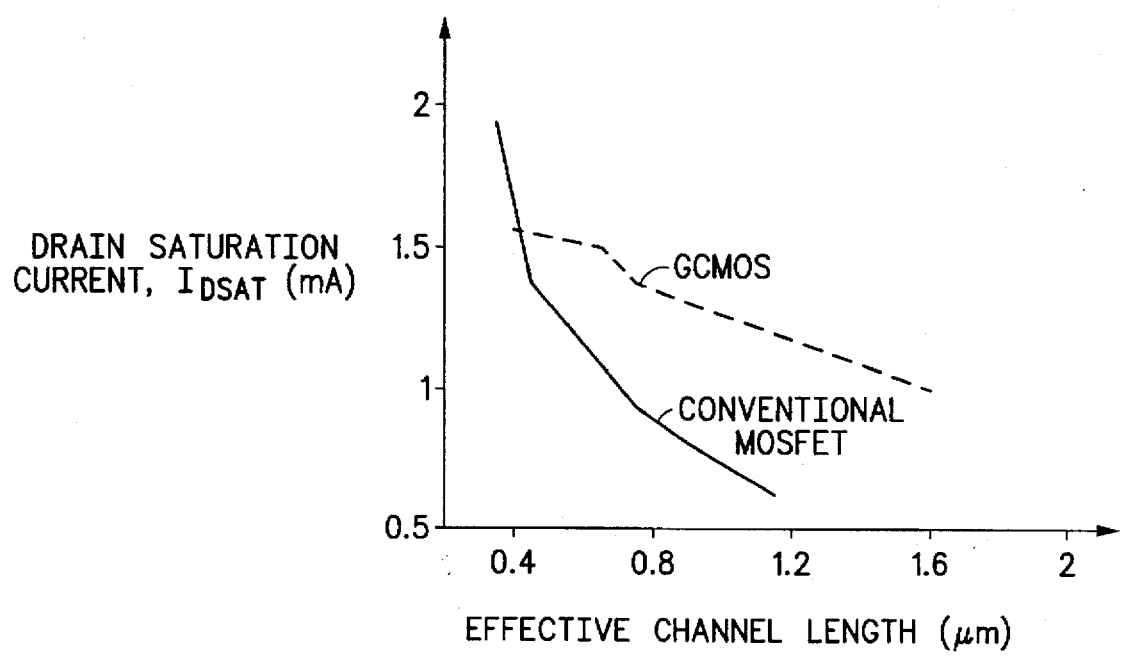
FIG. 22 illustrates, in an XY plot, drain saturation current versus gate voltage for a GCMOS device as compared to a conventional CMOS device in accordance with the present invention.

Yet another characteristic feature of GCMOS devices is the weak dependence of the drain saturation current on the effective channel length, compared to conventional MOSFETs. FIG. 22 shows a comparison of measured $I_{dsat}$ data from a GCMOS and a conventional device as a function of channel length. In conventional MOSFETs the drain saturation current $I_{dsat}$ scales roughly as the reciprocal of the effective channel length. However, in GCMOS devices it is found that $I_{dsat}$ is much less dependent on channel length variations. As before, this is due to the presence of the GC region. The drain current in these GCMOS structures is more sensitive to the characteristics of the GC region than the non-GC region. Since the "length" of the GC region is fairly insensitive to changes in the total channel length, $I_{dsat}$ is also less sensitive to changes in the total channel length.

Figure 23:
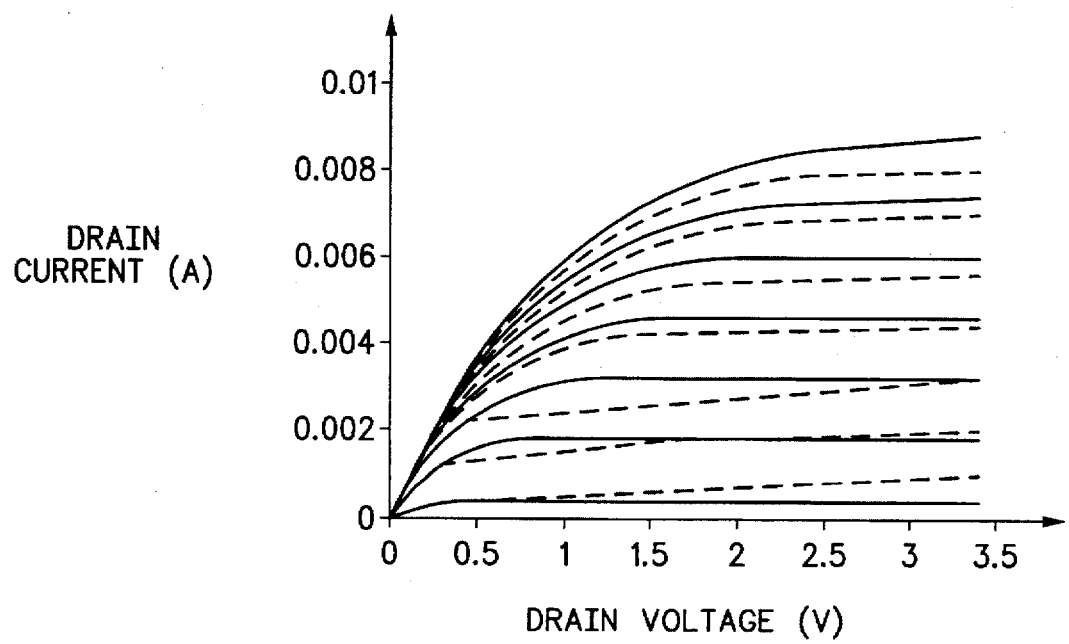
FIG. 23 illustrates, in an XY plot, drain saturation current versus gate voltage for a GCMOS device in forward operation as compared to a reverse operated GCMOS device in accordance with the present invention.

In conventional MOSFETs the source and drain are structurally and electrically indistinguishable. In GCMOS transistors, however, the GC region occurs only around the source in a preferred form, making them inherently asymmetric. As a result the forward and reverse mode characteristics of GCMOS devices are significantly different. Forward mode operation refers to the case when under steady state conditions mobile majority carriers flow from the source or GC end to the drain or non-GC end of the channel. Reverse or inverse mode refers to the case when majority carriers flow in the opposite direction. FIG. 23 shows measured drain current versus drain voltage data from a 24/1 micron (drawn) NMOS transistor. Both forward and reverse mode data are shown under identical biases. The difference between these two cases is clear in FIG. 23.

Figure 24:
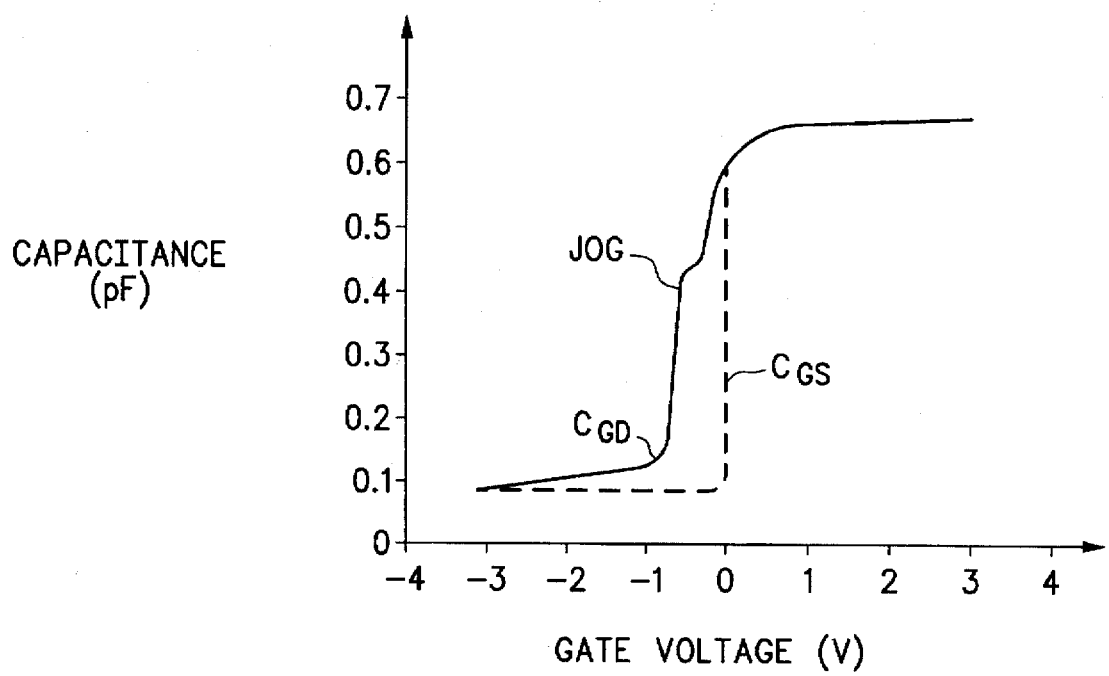
FIGS. 24 and 25 illustrate, in XY plots, capacitance versus gate voltage for a GCMOS device as compared to a conventional CMOS device in accordance with the present invention.

Another GCMOS characteristic lies in its gate capacitance characteristics. FIG. 24 shows measured gate to drain ($C_{gd}$) and gate to source ($C_{gs}$) capacitance data obtained from a 24/1 micron NMOS device as a function of gate voltage. It is seen that as the gate bias is increased, $C_{gs}$ increases smoothly from its minimum value to a plateau or upper limit as the channel inverts. On the other hand, $C_{gd}$ displays a jog as it increases from its minimum. The reason for this difference is as follows. When the gate bias is small, the channel region is depleted or accumulated and electrically isolated from the drain and source. Under this condition $C_{gs}$ and $C_{gd}$ are at their lower limits, determined by parasitic effects such as the gate overlap of the drain and source. As the gate bias is increased, the channel begins to invert acting effectively as an extension of the drain or source, and the capacitance begins to increase. Since the non-GC region adjacent to the drain end of the channel is more lightly doped than the source end, it inverts at a lower gate bias. Thus the drain effectively begins to extend under the gate at a lower gate bias than the source. Therefore, when $C_{gd}$ is measured, the capacitance begins to increase at a gate bias corresponding to the inversion of the non-GC region, reaching an intermediate value proportional to the length of the non-GC section of the channel. As the gate bias is further increased, the GC section of the channel also inverts and $C_{gd}$ reaches its upper limit, approximately equal to the gate oxide capacitance. On the other hand, when the gate to source capacitance $C_{gs}$ is measured as a function of gate bias, the non-GC section of the channel again inverts first, but remains electrically isolated from the source until the source end of the channel is also inverted. In other words, the source cannot effectively extend under the gate and hence $C_{gs}$ cannot increase from its lower limit until the gate bias is large enough to invert the GC section. At that point $C_{gs}$ increases directly to its upper limit.

Figure 25:
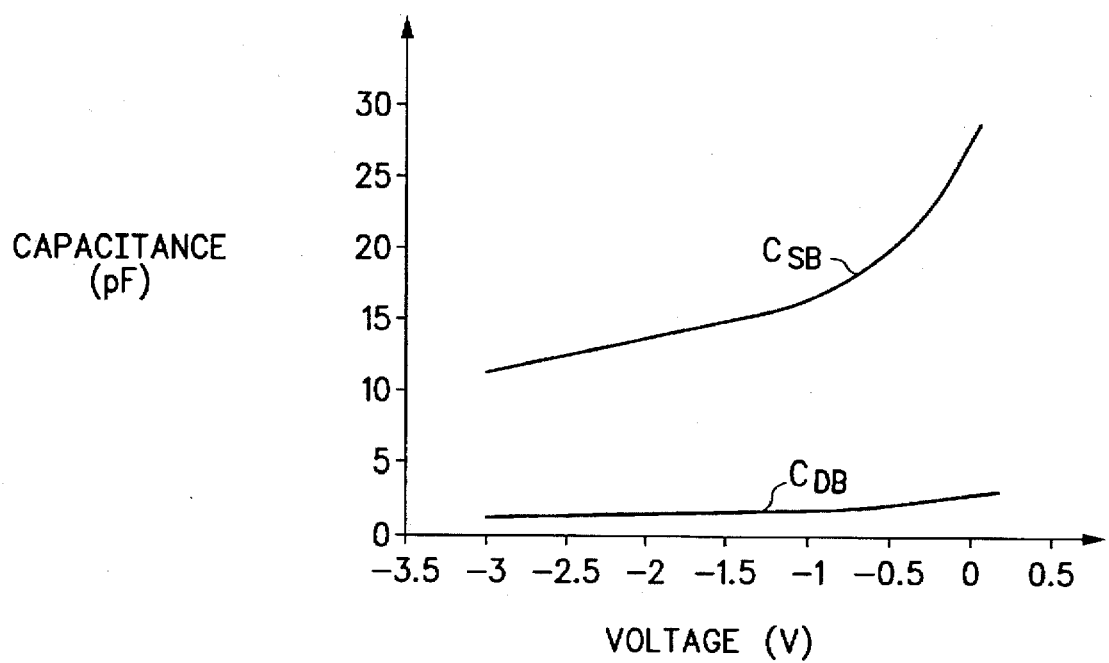

The presence of the GC region adjacent to the source also causes the source to body junction capacitance to be different from the drain to body capacitance. FIG. 25 shows source-body and drain-body junction capacitances measured from a 24/1 micron NMOS device. It can be seen that there is a large difference between the two capacitances. In conventional devices these two capacitances are identical.

It should be clear that the peculiarities of GCMOS transistors detailed above arise primarily from the laterally non-uniform channel doping inherent due to the GC region. As mentioned earlier these effects cannot be adequately modeled using conventional tools or models which are based on the assumption of a uniformly doped channel. The new model GCIM described herein allows these effects to be replicated in a straightforward yet accurate manner. Forward mode operation and a n-channel device are assumed unless otherwise stated. The changes necessary in the analysis for inverse mode operation are described in section 3.4.

3. Theoretical Considerations 3.1 Simplified Structure

The key to modeling GCMOS devices accurately lies in adequately accounting for the lateral position dependent channel doping profile. The channel doping decreases monotonically from a maximum value near the source as shown in FIG. 19. It is easy to see that for a given gate voltage the surface potential in such a device will be a function of position along the channel, even if the source and drain are biased equally. To accurately solve for the surface potential and mobile carrier densities in the channel in this case, a two-dimensional analysis is required. The related complexities in developing a compact model can be avoided by simplifying the lateral channel doping profile.

Figure 26:
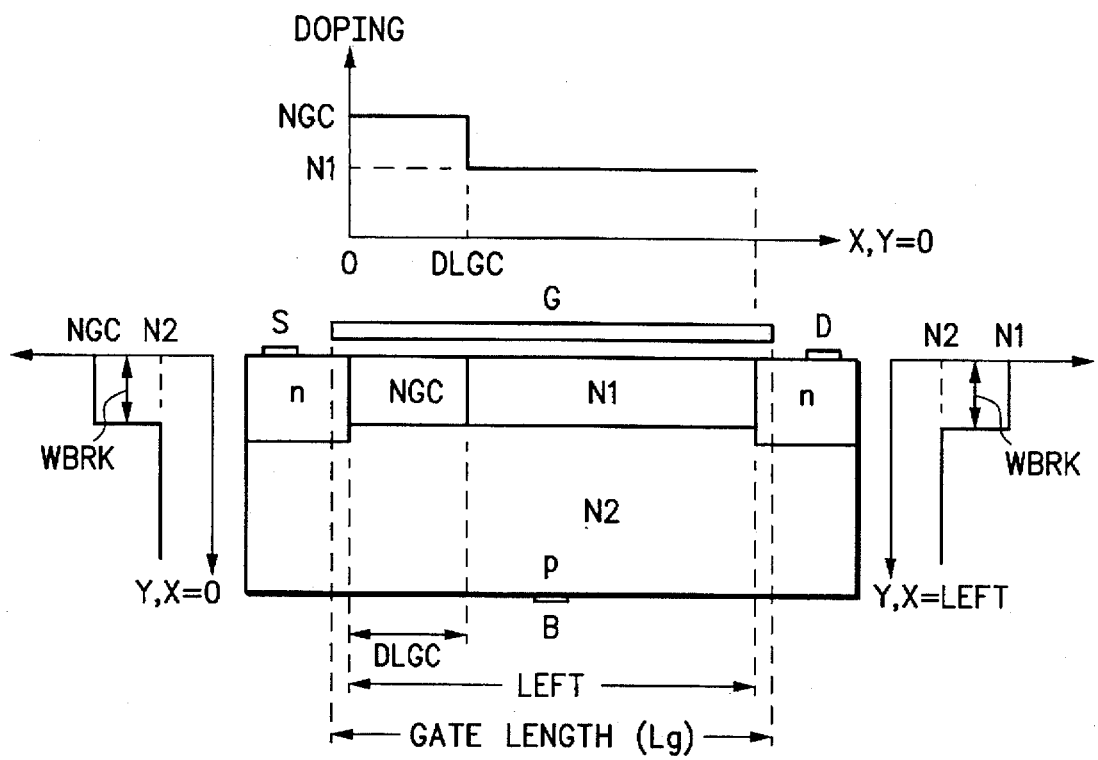
FIG. 26 illustrates in a cross sectional diagram a model approach to a GCMOS device in accordance with the present invention.

It has been found that GCMOS devices may be modeled quite accurately by representing the channel doping profile by a step function, as shown in FIG. 26. The channel is thus divided laterally into two sub-sections, a highly but uniformly doped "GC" section adjacent to the source and a lightly and uniformly doped "non-GC" section adjacent to the drain. The doping of the GC-section is represented by NGC which is a model parameter in GCIM. Its extension under the gate from the source is represented by $\Delta L_{GC}$ or DLCG.

It has also been found that as the gate length of the GCMOS device is shrunk, the size of the equivalent step profile in the x-direction $\Delta L_{GC}$ changes. To accommodate this effect, the dimension $\Delta L_{GC}$ is allowed to be a function of the effective channel length $L_{eff}$. The dependence is modeled in GCIM as $$\Delta L_{GC} = DLGC(1 - e^{-L_{eff}/DLGCL})^{DLGCE}$$

where DLGC is a GCIM model parameter representing the asymptotic limit of $\Delta LGC$ as $L_{eff}$ increases to infinity, and DLGCE and DLGCL are empirically based model parameters that can be used to fit the experimentally observed variation of $\Delta LGC$ with $L_{eff}$.

In addition to the lateral doping variation, the doping profile in the vertical (y) direction must also be considered. This profile is also approximated by a step function. The extension of the GC section in a vertical direction from the gate oxide-Si interface is given by WBRK. That is, the doping is equal to NGC in the region $0<x$, $\Delta L_{GC}$, and $0<y<WBRK$. The doping in the non-GC section $x>\Delta L_{GC}$ is given by N1 in the region $0<y<WBRK$. For $y>WBRK$ the doping is given by N2 for all x. The doping in the various regions are summarized in FIG. 26.

3.2 Steady State Drain Current and Terminal Charges

Figure 27:
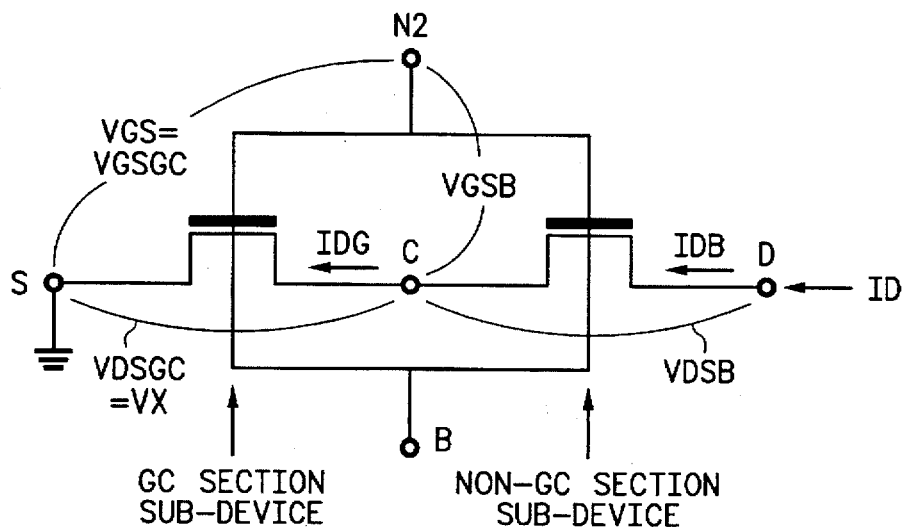
FIG. 27 illustrates in a circuit diagram a circuit used to model a GCMOS device in accordance with the present invention.

Considering the simplified structure of FIG. 27, the device may be treated as a series combination of two conventional sub-MOSFETs with laterally uniform channel doping. The first MOSFET has a surface channel doping of NGC and a channel length of $\Delta L_{GC}$, and is referred to as the GC device. The second transistor, referred to as the non-GC device, has a doping of N1 and a channel length equal to the total channel length of the device minus $\Delta L_{GC}$. This is represented schematically in FIG. 27.

Since the GC and non-GC device both have laterally uniform channel doping, they may be individually modeled using models similar or identical to conventional formulations. Therefore, the drain current $I_d$ through the composite device can be easily computed if the potential $v_x$ at the "interface" of the sub-devices is known. $v_x = vdsGC$ can be uniquely determined for a given set of terminal biases by using the constraint that the current conducted by each sub-device must be identical. With reference to FIG. 27, $I_d$ is given quantitatively as $$I_d = I_{dGC} = I_{dB} \tag{1a}$$

$$I_{dGC} = f(V_{gsGC}, V_{dsGC}, V_{bsGC}) \tag{1b}$$

$$I_{dB} = f(V_{gsB}, V_{dsB}, V_{bsB}) \tag{1c}$$

where $I_{dGC}$ and $I_{dB}$ represent, respectively, the drain current in the GC region and the non-GC region of the channel, $V_{gsGC}$ and $V_{gsB}$ represent, respectively, the gate to source voltage in the GC region and the non-GC region, $V_{dsGC}$ and $V_{dsB}$ represent, respectively, the drain to source voltage in the GC region and the non-GC region, and $V_{bsGC}$ and $V_{bsB}$ represent, respectively, the body to source voltage in the GC region and the non-GC region. The function $f$ represents the conventional formulation for channel current in terms of the local terminal biases of each sub-device. Inspecting FIG. 27 the following expressions may also be written:

$$V_{gsB} = V_{gs} - v_x \tag{1d}$$

$$V_{dsB} = V_{ds} - v_x$$

$$V_{gsGC} = V_{gs}, \quad V_{dsGC} = v_x, \quad V_{bsGC} = VSBFAC \times V_{bs} \quad V_{bsB} = V_{bs} - v_x$$

where VSBFAC is a GCIM model parameter representing the fraction of the external $V_{bs}$ that appears between the electron and hole quasi-fermi potentials at the surface of the GC section. By combining equations (1a) to (1d), $I_d$ and $v_x$ can be solved. However, because of the nature of the function $f$, the solution cannot be obtained analytically. An iterative or numerical scheme such as a bisection or a Newton-Raphson algorithm must be used to solve for $v_x$ and $I_d$.

It is important to note that the function $f$ above involves the use of a model parameter VTH0 which is the threshold voltage of a long channel device. In case of conventional MOSFETs the threshold voltage is fairly straightforward to define, but in the case of GCMOS devices it is considerably more difficult to do so because of the variation of channel doping in the lateral direction. However, for the simplified GCMOS structure of FIG. 8, two threshold voltages can be easily defined, one for the GC section and another for the non-GC section. At the same time, since the channel doping of the two regions are defined through NGC and N1, the correlation between the threshold voltages of the two sections is known. Hence it is sufficient to specify the threshold voltage of any one section. In GCIM the model parameter VTH0 is chosen to imply the threshold voltage of the non-GC region. The reason for this choice is that it is possible to measure this threshold voltage more accurately by building a "natural" MOSFET, i.e. one without the GC implant/diffusion. Once $v_x$ is determined, the terminal charges of the individual sub-devices can be easily obtained using the existing conventional formulations. These component charges are then combined using the analysis given below to obtain the charges in the composite device.

It is evident from FIGS. 26 and 27 that the gate charge $Q_G$ of the composite device is equal to the sum of the individual gate charges of the sub-devices. That is $$Q_g = Q_{gGC} + Q_{gB} \tag{2}$$

where $Q_gGC$ and $Q_gB$ refer to the gate charges of the GC section and the non-GC section respectively.

Unlike the gate charge, the drain charge of the composite device $Q_d$ cannot be obtained by simply adding the component charges from the GC and non-GC sections. By definition given Y. P. Tsividis, *Operation and Modeling of the MOS Transistor*, McGraw Hill, New York, 1987, $$Q_d = \frac{1}{L_{eff}} \int_0^{L_{eff}} x Q_i(x) dx \tag{3}$$

where x is lateral position as shown in FIG. 8, and $Q_i$ is the channel charge per unit width. By splitting the limits of integration, (3) can be re-written as $$Q_d = \frac{1}{L_{eff}} \int_0^{\Delta L_{GC}} x Q_i(x) dx + \frac{1}{L_{eff}} \int_{\Delta L_{GC}}^{L_{eff}} x Q_i(x) dx \tag{4}$$

Now, denoting $Q_i$ in the GC-region $0 < x < \Delta L_{GC}$ as $Q_{iGC}$, and in the non-GC region $\Delta L_{GC} < x < L_{eff}$ as $Q_{iB}$, (4) can be written after a change of variable as $$Q_d = \frac{1}{L_{eff}} \left\{ \int_0^{\Delta L_{GC}} x Q_{iGC}(x) dx + \int_0^{L_B} (y Q_{iB}(y) + \Delta L_{GC} Q_{iB}(y)) dy \right\} \tag{5}$$

where $y = (x - \Delta L_{GC})$, and $L_B = (L_{eff} - \Delta L_{GC})$. Further, since the integral of $Q_{iB}$ from 0 to $L_B$ is nothing but the total inversion charge in the non-GC region, it is clear that $$\int_0^{L_B} Q_{iB}(y) dy = Q_{sB} + Q_{dB} \tag{6}$$

where $Q_{sB}$ is the source charge and $Q_{dB}$ is the drain charge of the non-GC sub-device. Using (6) in (5) $Q_d$ can be written as $$Q_d = Q_{dB} + \frac{\Delta L_{GC}}{L_{eff}} (Q_{dGC} + Q_{sB}) \tag{7}$$

Using a similar analysis it can be shown that $$Q_s = Q_{sGC} + \left(1 - \frac{\Delta L_{GC}}{L_{eff}}\right)(Q_{sB} + Q_{dGC}) \tag{8}$$

Finally, as for the gate charge, the body charge $Q_b$ of the composite device can be obtained by simply adding the body charges of the component sub-devices. That is, $$Q_b = Q_{bB} + Q_{bGC} \tag{9}$$

The expressions used for evaluating the charge components $Q_{gGC}$, $Q_{gB}$, $Q_{sGC}$, $Q_{sB}$, etc. are the same as those used in conventional tools. They are not reproduced here for brevity.

3.3 Intrinsic Conductances and Capacitances

Once $v_x$ is determined, the conductances and capacitances of the individual sub-devices are also known. Using the same approach as for the charge, the conductances and capacitances of the component devices may be combined to obtain the corresponding values for the composite device structure. The analysis necessary for this is shown below.

Differentiating eqn. 1(a) with respect to $V_{gs}$ gives $$\frac{\partial I_{dGC}}{\partial V_{gsGC}} + \frac{\partial I_{dGC}}{\partial V_{dsGC}} \frac{\partial v_x}{\partial V_{gs}} = \frac{\partial I_{dB}}{\partial V_{gsB}}\left(1 - \frac{\partial v_x}{\partial V_{gs}}\right) - \frac{\partial I_{dB}}{\partial V_{dsB}} \frac{\partial v_x}{\partial V_{gs}} - \frac{\partial I_{dB}}{\partial V_{bsB}} \frac{\partial v_x}{\partial V_{gs}} \quad (10)$$

For algebraic simplicity VSBFAC has been assumed to be unity in this section. In the actual MCSPICE implementation the algebra is modified as necessary to accommodate any user defined value of VSBFAC. It should be noted that the left and right hand sides of (10) both represent total gate transconductance of the device. It should also be noted that the partial differentials of $I_{dGC}$ and $I_{dB}$ in (10) represent the different transconductances of the GC sub-device and the non-GC sub-device, respectively. For example $\partial I_{dGC}/\partial V_{gsGC}$ is the transconductance of the GC sub-device ($g_{mGC}$) and $\partial I_{dGC}/\partial V_{dsGC}$ is its output conductance ($g_{dsGC}$). Therefore (10) can be re-written as $$g_{mGC} + g_{dsGC}\frac{\partial v_x}{\partial V_{gs}} = g_{mB}\left(1 - \frac{\partial v_x}{\partial V_{gs}}\right) - g_{dsB}\frac{\partial v_x}{\partial V_{gs}} - g_{mbs}\frac{\partial v_x}{\partial V_{gs}} \quad (11)$$

where $g_{dsB}$ and $g_{mbsB}$ refer to the output conductance and the body transconductance of the non-GC sub-device, respectively. From (11) an expression can be obtained for $\partial v_x/\partial V_{gs}$. This expression can then be substituted in the right or left hand side of (10) to yield the total gate transconductance of the device. Performing these manipulations yields $$\frac{\partial v_x}{\partial V_{gs}} = \frac{g_{mB} - g_{mGC}}{g_{mB} + g_{dsGC} + g_{dsB} + g_{mbsB}} \quad (12)$$

and $$g_m = g_{mGC} + g_{dsGC}\left\{\frac{g_{mB} - g_{mGC}}{g_{mB} + g_{dsGC} + g_{dsB} + g_{mbsB}}\right\} \quad (13)$$

Since $v_x$ is known, the individual conductances for the GC and non-GC sub-devices on the right hand side of (13) may be evaluated using existing conventional formulations and the local bias values obtained from (1d). Using a similar analysis the other conductances $g_{ds}$ and $g_{mbs}$ can be obtained.

The calculation of capacitance is considered next. The capacitance eggs ($=\partial Q_G/\partial V_{gs}$) is used as an example. First, both sides of equation (2) are differentiated with respect to $V_{gs}$, noting that $Q_{GGC}$ is a function of $V_{gsGC}$, $V_{dsGC}$, and $V_{bsGC}$, and that $Q_{GB}$ is a function of $V_{gsB}$, $V_{dsB}$, and $V_{bsB}$. Using (1d) in the result of the differentiation gives (assuming VSBFAC=1 as before):

$$c_{ggs} = \frac{\partial Q_G}{\partial V_{gs}} = \frac{\partial Q_{GGC}}{\partial V_{gsGC}} + \frac{\partial Q_{GCC}}{\partial V_{dsGC}} \frac{\partial v_x}{\partial V_{gs}} + \frac{\partial Q_{GB}}{\partial V_{gsB}}\left(1 - \frac{\partial v_x}{\partial V_{gs}}\right) + \frac{\partial Q_{GB}}{\partial V_{dsB}}\left(-\frac{\partial v_x}{\partial V_{gs}}\right) + \frac{\partial Q_{GB}}{\partial V_{bsB}}\left(\frac{\partial v_x}{\partial V_{gs}}\right) \quad (14)$$

Since the partial differentials of $Q_{GGC}$ and $Q_{GB}$ on the right hand side of (14) represent capacitances local to the GC sub-device and the non-GC sub-device, $c_{ggs}$ can be written as $$c_{ggs} = c_{ggsGC} + c_{ggsB} + \{c_{gdsGC} - c_{ggsB} - c_{gdsB} - c_{gbsB}\}\frac{\partial v_x}{\partial V_{gs}} \quad (15)$$

Since $v_x$ is known, the individual capacitances for the GC and non-GC sub-devices on the right hand side of (15) may be evaluated using existing conventional formulations and the local bias values obtained from (1d). Using a similar analysis closed form expressions for the other transcapacitances may be obtained.

3.4 Inverse Mode Operation

The only difference between forward and inverse mode of operation is the designation of source and drain terminals. While in forward mode the source lies adjacent to the NGC region, in inverse mode it is the drain that is adjacent to the NCG region. The gate and substrate terminals are unchanged. To a first order, the analysis presented above for forward mode can be applied to inverse mode by simply interchanging the respective parameters. That is, inverse mode operation can be modeled approximately by interchanging N1 with NGC, and $\Delta L_{GC}$ with ($L_{eff}-\Delta L_{GC}$). This switching is automatically performed by the software to get the GCIM model. To improve upon this approach, a different velocity saturation model and a different DIBL model should be used in inverse mode. This is because the greatest difference between forward and reverse mode lies in the drain saturation current, which is dependent on velocity saturation, and in the output conductance which is determined by DIBL. It has been found that these effects can be accommodated by keeping the general forms of the respective models identical in both modes, but allowing the model parameters ESAT0, ESAT1, and DIBLL to have different values in forward and inverse modes. Their inverse mode values are represented by the new GCIM parameters ESAT0R, ESAT1R, and DIBLLR, respectively.

3.5 Parasitic Effects

To accurately model the behavior of MOSFETs the effects of certain parasitics must be taken into account. The primary parasitic effects are the non-zero source and drain resistances, the source to body and drain to body capacitances, as well as the fringing capacitance associated with the overlap of the gate with the source/drain regions. The basic models used in conventional tools to replicate these parasitic effects are continued to be used in GCIM. However, since conventional tools were developed for conventional MOSFET structures with identical source and drains, the source side parasitics and drain side parasitics are computed in conventional tools using the same model parameter values. In GCMOS devices, on the other hand, because of the presence of the GC region the source is quite different from the drain. For example, the source to body zero-bias capacitance is much greater than the corresponding drain to body value. This effect is accommodated in GCIM by using the same equations as in conventional tools to model both source and drain side parasitic effects, but allowing the associated model parameters to have different values for the source and drain sides.

4. Experimental Measurements

A complete set of GCIM parameters have been generated for a current GCMOS process for both n-channel and p-channel devices. The novel parameters NGC, VSBFAC, DLGC, DLGCL, and DLGCE were obtained by fitting measured and calculated drain currents and transconductances in the linear region as a function of gate to source voltage and body to source voltage for a series of gate lengths. VTH0 was obtained from long channel "natural" devices. Other parameters were obtained using existing procedures for conventional tools, a discussion of which is outside the scope of this report. The inverse mode parameters ESAT0R, ESAT1R, and DIBLLR were derived from the output characteristics obtained by operating the device in inverse mode. Among the extrinsic parameters, the channel edge component of the source/body junction capacitance was found to be significantly different from the drain body component. Other extrinsic parameters were identical between source and drain sides for this process. In this section comparisons are presented between several sets of measured and simulated data obtained from GCIM. The final model parameter values are summarized in Table I.

Figure 28:
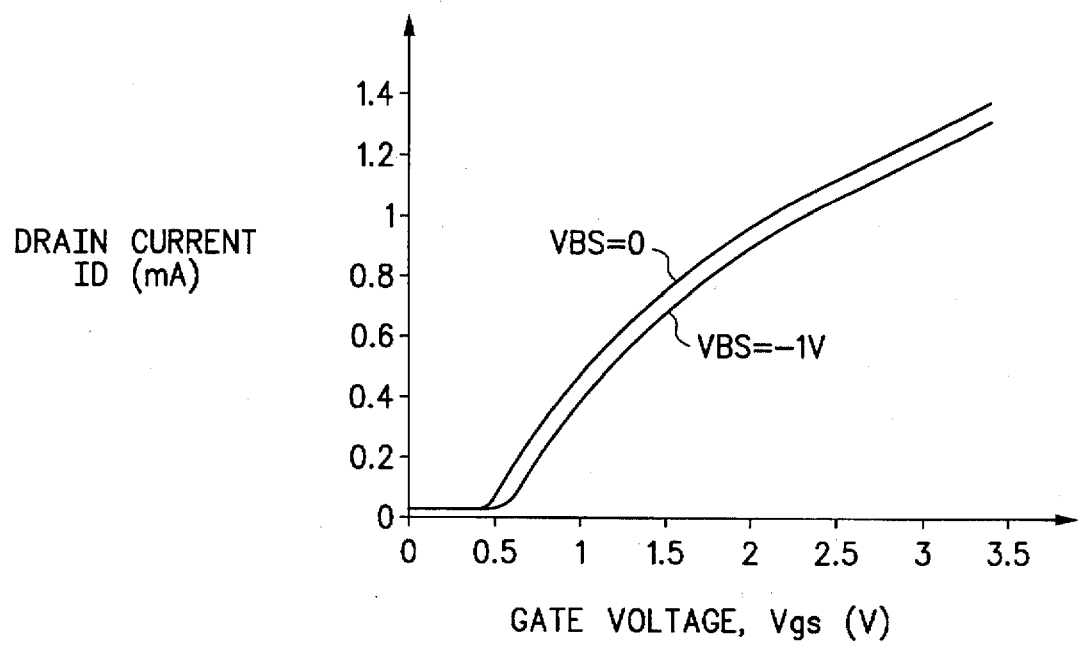
FIGS. 28–35 compare, in XY plots, the simulated data from a model of a GCMOS device in accordance with the present invention to an actual GCMOS device to show the high degree of model correlation to the actual GCMOS physical and electrical characteristics.
Figure 29:
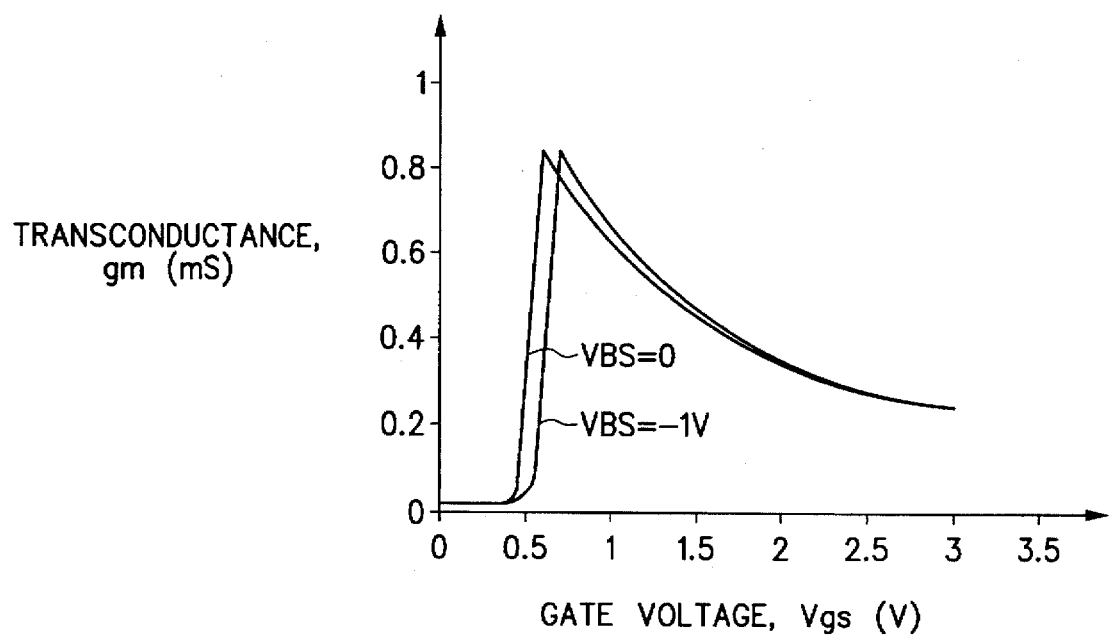

Data comparing measured and simulated $I_d$ versus $V_{gs}$ data for a NMOS device having a drawn W/L ratio of 24/2.2 and biased in the forward linear region have been collected and show extreme accuracy of the GCIM model. The corresponding transconductance data was also collected and were closely matched. Similar data for a 24/0.8 device (nominal sized drawn gate length for this technology) are shown in FIGS. 28–29. In all cases a good match is obtained between measurement and simulation. In particular, the simulated transconductance exhibits the spike feature discussed earlier and matches measurements closely.

Figure 30:
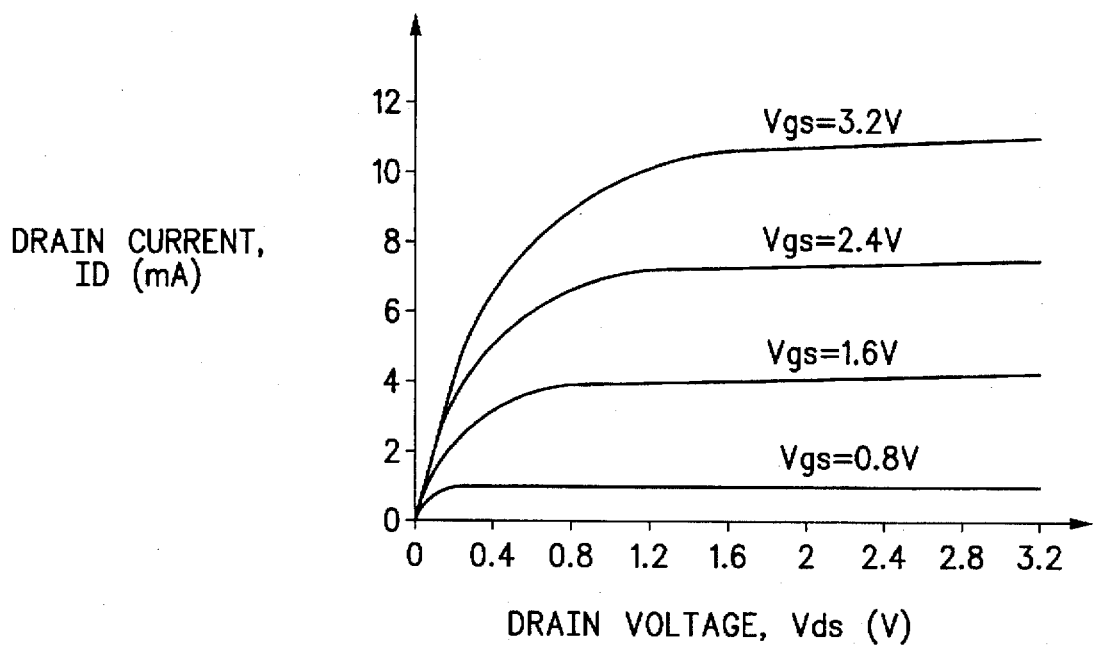
Figure 31:
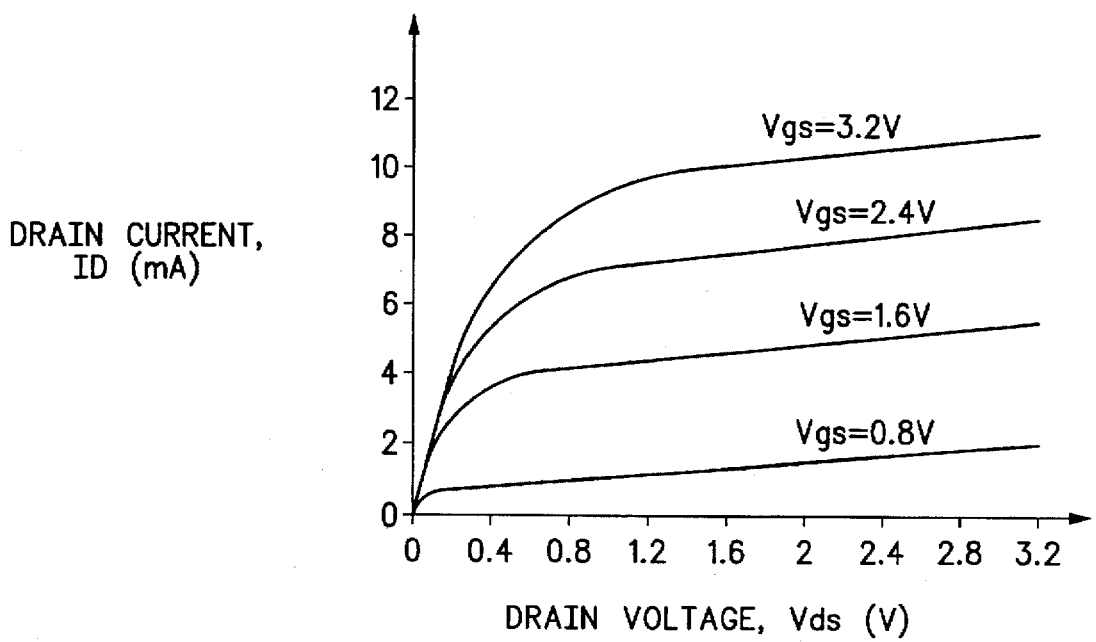

In FIGS. 30–31 measured and simulated $I_d$ versus $V_{ds}$ (output characteristics) of a 24/0.8 NMOS device are shown for a series of $V_{gs}$ values in the forward mode. Data is shown in FIG. 31 for operation in inverse mode. Again, there is good match between measured and simulated data in both modes. It is evident that the output conductance in the saturation region is significantly higher in inverse mode. This is due to a stronger DIBL effect in this mode of operation. To get the close match between measurement and simulation shown in FIG. 12, a much larger value was required for the inverse mode parameter DIBLLR than the corresponding forward mode parameter DIBLL.

Figure 32:
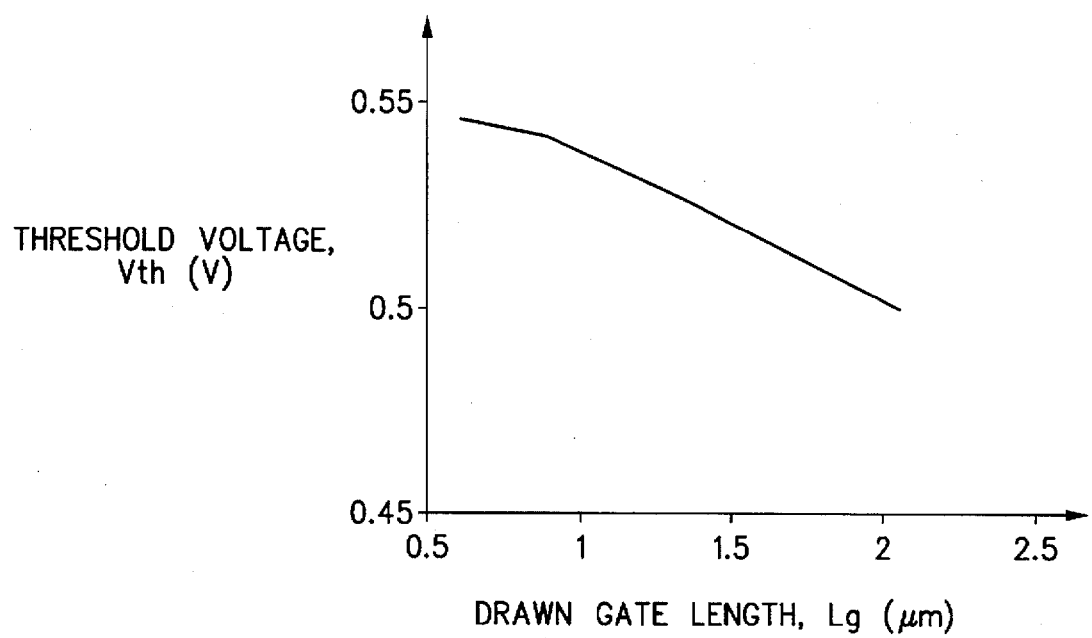

In FIG. 32, measured and simulated threshold voltages are shown as a function of drawn gate length. There is a small discrepancy between measured and simulated threshold voltages at the longer channel lengths. This difference is an artifact of the threshold voltage measurement technique. These threshold voltages values were obtained by using the standard method of tangentially extrapolating the $I_d$-$V_{gs}$ data in the linear region around the peak gm value of $V_{gs}$. Since the peak $g_m$ point is extremely sharp in GCMOS structures, the slope and intercept of a tangent is quite sensitive to the location of the data points, causing a relatively large variability in the result. In other words, a small difference between measured and simulated $I_d$ at a given $V_{ds}$, results in a large difference in the corresponding extracted threshold voltages in GCMOS devices. It should also be noted that the threshold voltage values of FIG. 32 are very different in significance and value from the model parameter VTH0.

Figure 33:
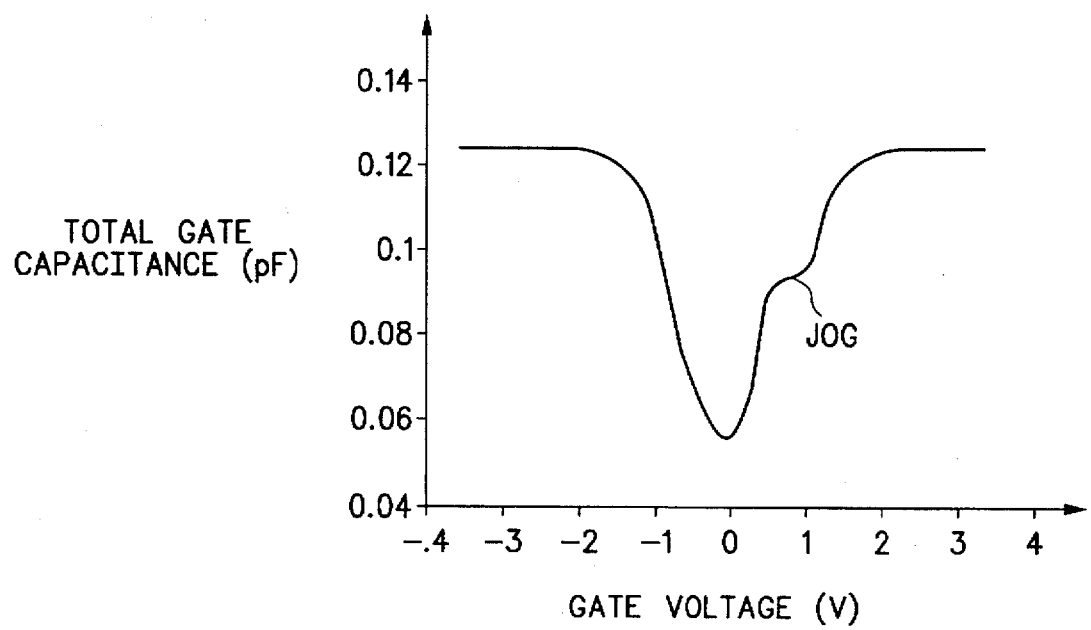

FIG. 33 shows the variation of total gate capacitance with gate voltage simulated using GCIM. The characteristics jog seen earlier in the measured data of FIG. 24 is also evident in the simulated data.

Figure 34:
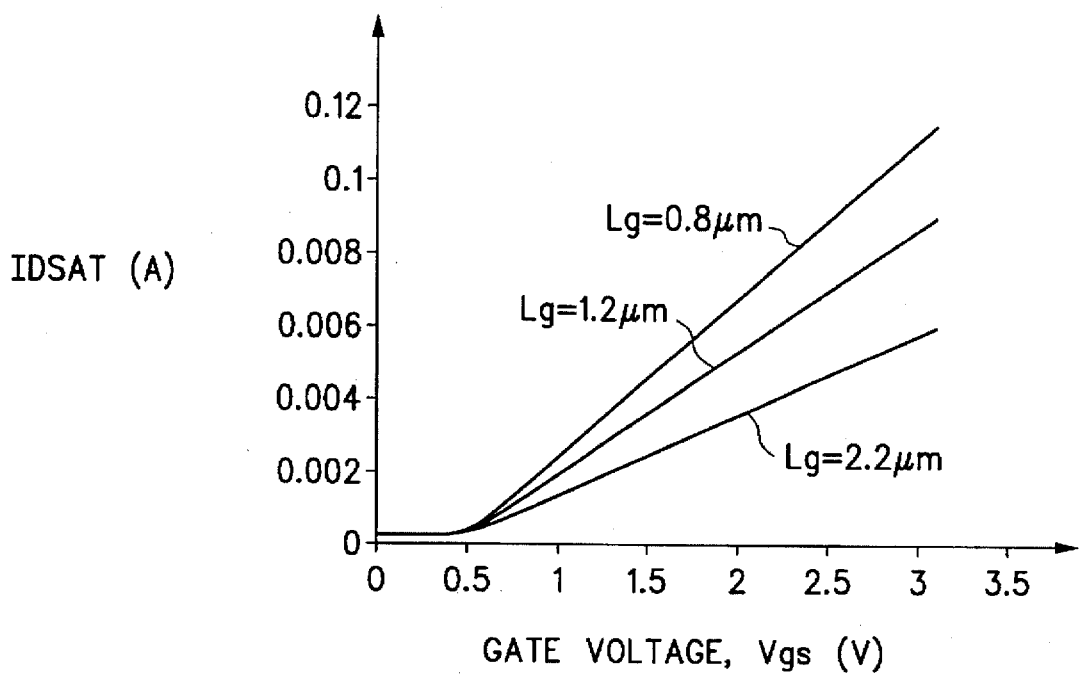

Finally, FIG. 34 shows a comparison of measured and GCIM simulated $I_{dsat}$ values for a series of n-channel devices. As in other cases, a close match is obtained between measurement and simulation. The weak dependence of $I_{dsat}$ on the channel length in GCMOS devices discussed in Section 2 is also exhibited in the data of FIG. 34.

Figure 35:
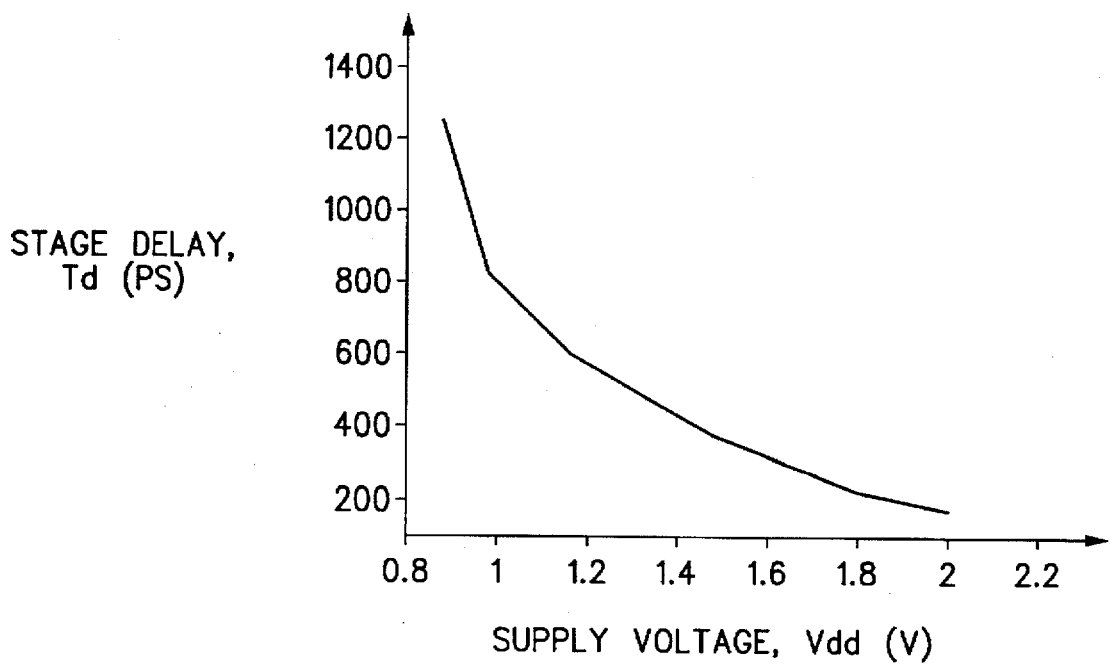

To validate the model and the associated parameter values comparisons were also done between measured and simulated inverter gate delays. This quantity was measured by monitoring the oscillation frequency of a 101 stage ring oscillator. Each stage was composed of a simple CMOS inverter and had a fan-out of two. The results obtained from measurements and simulations are compared in FIG. 35. It is found that the two sets of data agree within a few percent of each other.

Although the new GCIM model accurately replicates GCMOS characteristics, because of its iterative nature GCIM is computationally more time consuming than the conventional model. The difference in simulation times between GCIM and conventional models is a function of the size of the circuit simulated, increasing as the circuit size increases. It is also dependent on the type of simulation being performed, with transient analyses being the most time consuming. As an extreme example, the 101-stage ring oscillator described above takes about 9 times longer to simulate ten oscillation cycles using GCIM than conventional models on a HP 900 series computer, although the same number of internal time-step iterations are required in both cases.

5. MCSPICE Implementation

In this section details about the invocation and use of GCIM in MCSPICE are presented. General form of the .MODEL statement in the SPICE deck required to use the GCIM model is as follows:

MODEL mname NMOS|PMOS[LEVEL=7+[[GRADING= UNILAT|BILAT]+pname1=pval1 pname2=pval2 ... ]

Level =7 refers to the GCIM MOSFET model in MCSPICE. The parameter called grading can be used to specify whether the device type is unilateral or bilateral. While unilateral devices are the ones discussed in this report, bilateral devices refer to the GCMOS transistor structures that receive the GC implant on both the source and the drain sides. Although the model described in this report was developed purely for unilateral GCMOS transistors, it is used in a slightly modified and approximate form if the device type is specified as bilateral. It is obvious that bilateral devices have no source/drain asymmetry. Therefore, the inverse mode calculations described in section 3.4 are not performed if the grading parameter is specified as BILAT. The only other modification for bilateral devices is in the calculation of $\Delta L_{GC}$. It is given as $$\Delta L_{GC} = 2DLGC(1-e^{-L_{eff}/DLGCB})^{DLGCB}$$

which is exactly twice the value of a similar unilateral transistor since the GC section now occupies portions of the channel around both source and drain. This is really an approximation. To model the bilateral structure in a manner analogous to the unilateral FET, the device should be represented by a series combination of three uniformly doped sub-devices, the first for the GC region around the source, the second for the non-GC section in the middle, and the third for the GC region around the drain. However, considering the fact that bilateral devices are used only rarely in practice, the additional complexity of using a three-section model is not worthwhile. The approximate approach used here models all of the effects seen in bilateral devices quite well.

As mentioned earlier the parameters in GCIM that are used to calculate parasitic element values can have different values for the source and drain sides. To assign distinct values to the source and drain sides, the respective parameter names must be prefixed with S__ or D__. If no prefix is used, the drain and source parameters are assigned the same value.

Table I is a summary of all the parameters introduced in the GCIM model over and above any conventional parameter set. The default values of the parameters NGC and DLGC were chosen so as to yield a uniform lateral doping profile. Thus, by default, the model can be set to be reduced to the conventional model in order to model both conventional devices and GCMOS devices simultaneously.

TABLE I

GCIM MODEL PARAMETER SUMMARY

| Parameter | Description | Default (Units) |
|---|---|---|
| GRADING | Channel grading type | UNILAT |
| NGC | graded channel region doping | (N1) cm-3 |
| DLGC | length of GC region | 0.0 micron |
| DLGCL | decay length of GC region | 1.0 micron |
| DLGCE | decay exponent of GC region | 0.0 |
| VSBFAC | vbs fraction for GC region | 0.4 |
| DIBLLR | DIBLL in inverse mode | 0.0 |
| ESAT0R | ESAT0 in inverse mode | 2.0 |
| ESAT1R | ESAT1 in inverse mode | 1.0 |

6. Summary

In summary, a new model called GCIM has been developed that allows an accurate simulation of GCMOS transistor electrical characteristics, unlike any model used to date. GCMOS device characteristics are significantly different from those of a conventional MOSFET because of the laterally non-uniform doping from the source end to the drain end of its channel. The new model reproduces the effect by approximating this channel doping profile with a step function and using multiple transistor models for a single transistor channel region.

The GCIM model has been used to characterize current GMOS processes and parameters have been extracted for this process. Excellent match has been demonstrated between measured data and simulated data obtained from the GCIM model. The model has also been incorporated in MCSPICE and has exhibited excellent results over the currently known technology.

We claim:

1. A method for modeling a transistor comprising a drain, a source, a gate and a channel region, wherein the channel region comprises a first channel portion and a second channel portion, the first channel portion having a doping concentration greater than a doping concentration of the second channel portion, the method comprising the steps of:

(a) receiving a geometry and a doping concentration of the first channel portion from memory;

(b) receiving a geometry and a doping concentration of the second channel portion from memory;

(c) determining a first transistor model for the first channel portion based on the geometry and doping of the first channel portion, wherein the first transistor model assumes a uniform doping concentration within the first channel portion;

(d) determining a second transistor model for the second channel portion based on the geometry and doping of the second channel portion, wherein the second transistor model assumes a uniform doping concentration within the second channel portion;

(e) assuming a junction voltage level at an interface between the first transistor model and the second transistor model;

(f) determining a channel current of the first transistor model based on the junction voltage;

(g) determining a channel current of the second transistor model based on the junction voltage;

(h) repeating steps (e) through (g) until the channel current of the first transistor model substantially equals the channel current of the second transistor model; and (i) combining the first transistor model and the second transistor model to form a composite transistor model for the transistor.

2. The method of claim 1, wherein step (i) further comprises forming a composite transistor model having continuous charge and current functions, wherein the functions are differentiable so that the model may operate with standard circuit simulators.

3. The method of claim 2, further comprising the step of determining a derivative function of the composite transistor model.

4. The method of claim 1, further comprising the steps of:

(j) modeling a plurality of transistors in a design file using the composite transistor model to create a design model; and (k) using the design model to manufacture the plurality of transistors.

5. The method of claim 4, wherein step (k) includes the step of manufacturing the plurality of transistors on a single substrate.

6. The method of claim 1, wherein step (i) further comprises forming a composite transistor model for the transistor that is scalable with respect to a geometry of the transistor.

7. The method of claim 1, wherein step (i) further comprises forming a composite transistor model for the transistor that is scalable with respect to a length of the transistor.

8. The method of claim 1, wherein step (i) further comprises forming a composite transistor model for the transistor that is scalable with respect to a width of the transistor.

9. The method of claim 1, wherein step (i) further comprises forming a composite transistor model for the transistor that is scalable with respect to a gate voltage applied to the transistor.

10. The method of claim 1, wherein step (i) further comprises forming a composite transistor model including at least one equivalent circuit element selected from the group consisting of transconductances, output conductances, transcapacitances, and substrate current sources.

11. The method of claim 1, wherein:

step (a) includes receiving a geometry and a doping concentration of the first channel portion of a field effect transistor; and step (b) includes receiving a geometry and a doping concentration of the second channel portion of the field effect transistor.

12. The method of claim 1, wherein step (i) includes forming a composite transistor model for the transistor, and wherein the composite transistor model has a transconductance variance caused by an inversion of the second channel portion prior to an inversion of the first channel portion when biasing the gate of the transistor.

13. The method of claim 1, wherein step (i) includes forming a composite transistor model for the transistor, and wherein the composite transistor model has a capacitance variance caused by an inversion of the second channel portion prior to an inversion of first channel portion when biasing the gate of the transistor.

14. The method of claim 1, wherein:

step (a) includes receiving a geometry and a doping concentration of the first channel portion of a metal oxide silicon field effect transistor; and step (b) includes receiving a geometry and a doping concentration of the second channel portion of the metal oxide silicon field effect transistor.

15. The method of claim 1, wherein:
step (a) includes receiving a geometry and a doping concentration of the first channel portion of a bilateral metal oxide silicon field effect transistor; and
step (b) includes receiving a geometry and a doping concentration of the second channel portion of the bilateral metal oxide silicon field effect transistor.

16. A transistor model representing a transistor comprising a drain, a source, a gate and a channel region, wherein the channel region comprises a first channel portion and a second channel portion, the first channel portion having a doping concentration greater than a doping concentration of the second channel portion, the model comprising: p1 a first transistor model, wherein the first transistor model represents the first channel portion and assumes a first uniform doping concentration of the first channel portion;
a second transistor model operably coupled to the first transistor model, wherein the second transistor model represents the second channel portion and assumes a second uniform doping concentration of the second channel portion different from the doping concentration of the first channel portion;
a modeled junction voltage between the first transistor model and the second transistor model, wherein the modeled junction voltage causes the first transistor model and second transistor model to have equal channel currents; and
a composite transistor model, wherein the composite transistor model is derived by combining the first transistor model and the second transistor model to model the physical operation of the transistor.

17. The transistor model of claim 16, wherein the composite transistor model further comprises continuous charge and current functions, and wherein the functions are differentiable so that the model may operate with standard circuit simulators.

18. The transistor model of claim 16, wherein the composite transistor model further comprises circuit parameters that are scalable with respect to a geometry of the transistor.

19. The transistor model of claim 16, wherein the composite transistor model further comprises circuit parameters that are scalable with respect to a length of the transistor.

20. The transistor model of claim 16, wherein the composite transistor model further comprises circuit parameters that are scalable with respect to a width of the transistor.

21. The transistor model of claim 16, wherein the composite transistor model further comprises circuit parameters that are scalable with respect to a gate voltage applied to the transistor.

22. The transistor model of claim 16, wherein the composite transistor model further comprises at least one equivalent circuit element selected from the group consisting of transconductances, output conductances, transcapacitances, and substrate current sources.

23. The transistor model of claim 16, wherein the composite transistor model comprises a model of a field effect transistor.

24. The transistor model of claim 16, wherein the composite transistor model comprises a model of a metal oxide silicon field effect transistor.

25. The transistor model of claim 16, wherein the composite transistor model comprises a model of a bilateral metal oxide silicon field effect transistor.

26. The transistor model of claim 16, wherein the composite transistor model for the transistor further comprises a transconductance function having a variance caused by an inversion of the second channel portion prior to an inversion of the first channel portion during a biasing of the gate of the transistor.

27. The transistor model of claim 16, wherein the composite transistor model for the transistor further comprises a capacitance function having a variance caused by an inversion of the second channel portion prior to an inversion of the first channel portion during a biasing of the gate of the transistor.

28. An integrated circuit comprising a plurality of transistors, wherein at least a portion of the plurality of transistors comprise graded channel transistors each having a drain, a source, a gate, and a channel region, wherein each of the channel regions comprises a first channel portion and a second channel portion, the first channel portion having a doping concentration greater than a doping concentration of the second channel portion, and wherein each of the graded channel transistors is modeled by a model comprising:
a first transistor model, wherein the first transistor model represents the first channel portion and assumes a first uniform doping concentration;
a second transistor model operably coupled to the first transistor model, wherein the second transistor model represents the second channel portion and assumes a second uniform doping concentration different from the first uniform doping concentration;
a modeled junction voltage between the first transistor model and the second transistor model, wherein the modeled junction voltage causes the first transistor model and second transistor model to have equal channel currents; and
a composite transistor model, wherein the composite transistor model is derived by combining the first transistor model and the second transistor model to model the physical operation of the transistor.

29. A graded channel field effect transistor comprising:
a source region;
a first channel portion operably coupled to the source region, wherein the first channel portion has a first doping concentration, and wherein the first channel portion is modeled by a first transistor model, wherein the first transistor model represents the first channel portion and assumes a first uniform doping concentration;
a second channel portion operably coupled to the first channel portion, wherein the second channel portion has a second doping concentration different than the first doping concentration, wherein the second channel portion is modeled by a second transistor model operably coupled to the first transistor model, wherein the second transistor model represents the second channel portion and assumes a second uniform doping concentration different from the first uniform doping concentration;
a drain region operably coupled to the second channel portion; and
a gate operably coupled to the first channel portion and the second channel portion, wherein upon the application of a biasing voltage to the gate, the first channel portion and second channel portions invert.

30. A method for manufacturing a plurality of integrated circuits, wherein the method comprises the steps of:
(a) receiving an integrated circuit design file, wherein the integrated circuit design file includes the plurality of integrated circuits, and wherein at least a portion of the integrated circuits include graded channel transistors;

(b) modeling a graded transistor comprising a drain, a source, a gate and a channel region, wherein the channel region comprises a first channel portion and a second channel portion, wherein the first channel portion has a doping concentration greater than a doping concentration of the second channel portion, wherein modeling the graded channel transistor comprises the steps of:
  (i) determining a length and a doping of the first channel portion;
  (ii) determining a length and a doping of the second channel portion;
  (iii) defining a first transistor model for the first channel portion assuming a uniform doping concentration of the first channel portion;
  (iv) defining a second transistor model for the second channel portion assuming a uniform doping concentration of the second channel portion;
  (v) assuming a junction voltage level between the first transistor model and the second transistor model;
  (vi) calculating a channel current of the first transistor model based on the junction voltage;
  (vii) calculating a channel current of the second transistor model based on the junction voltage;
  (viii) repeating steps (v) through (vii) until the channel current of the first transistor model substantially equals the channel current of the second transistor model; and
  (ix) combining the first transistor model and the second transistor model to form a composite transistor model for the transistor;
(c) applying the model to a plurality of graded transistors in the integrated circuit design file to create an integrated circuit design model, wherein the plurality of graded channel transistors are interoperably coupled to operate as one integrated circuit among the plurality of integrated circuits; and
(d) manufacturing the plurality of integrated circuits in accordance with the integrated circuit design model.

31. A method for determining an intermediate voltage at a junction point in a channel region of a transistor, the transistor comprising a drain, a source, a gate and a channel region, wherein the channel region comprises a first channel portion and a second channel portion, wherein the first channel portion has a doping concentration greater than a doping concentration of the second channel portion, and wherein the junction point lies at an interface between the first channel portion and the second channel portion, the method comprising the steps of:
  (a) determining a first transistor model for the first channel portion assuming a uniform doping concentration of the first channel portion;
  (b) determining a second transistor model for the second channel portion assuming a uniform doping concentration of the second channel portion different than the doping concentration of the first channel portion;
  (c) assuming a junction voltage between the first transistor model and the second transistor model;
  (d) calculating a channel current of the first transistor model based on the junction voltage;
  (e) calculating a channel current of the second transistor model based on the junction voltage; and
  (f) repeating steps (a) through (e) until the channel current of the first transistor model substantially equals the channel current of the second transistor model.

32. The method of claim 31, further comprising the step of repeating steps (a) through (f) to create an integrated circuit design file for a plurality of transistors.

33. The method of claim 32, further comprising the step of using the integrated circuit design file to manufacture a plurality of integrated circuits based upon the circuit design file.

34. A method for creating a model of a transistor, the method comprising the steps of:
  (a) determining a plurality of transistor models, wherein each of the plurality of transistor models represents a portion of a channel of the transistor, wherein each of the plurality of transistor models assumes a uniform doping concentration of a respective channel portion, and wherein at least two of the plurality of transistor models assume differing doping concentrations;
  (b) coupling the plurality of transistor models such that a respective junction voltage level resides between adjacent transistor models;
  (c) assuming a value for each of the respective junction voltage levels;
  (d) calculating a channel current of each of the plurality of transistor models based on the respective junction voltage levels; and
  (e) repeating steps (c) through (d) until the channel currents of each of the plurality of transistor models is substantially equal.

35. The method of claim 34 further comprising the step of:
  (f) combining the plurality of transistor models to form a composite transistor model for the transistor.

36. A method for modeling a transistor comprising a drain, a source, a gate and a channel region, wherein the channel region comprises a first channel portion, a second channel portion, and a third channel portion, wherein the first channel portion and the third channel portion have a doping concentration greater than a doping concentration of the second channel portion, the method comprising the steps of:
  (a) receiving a geometry and a doping concentration of the first channel portion;
  (b) receiving a geometry and a doping concentration of the second channel portion;
  (c) receiving a geometry and a doping concentration of the third channel portion;
  (d) determining a first transistor model for the first channel portion and the third channel portion assuming a uniform doping concentration of a channel portion of the first transistor model;
  (e) determining a second transistor model for the second channel portion assuming a uniform doping concentration of a channel portion of the second transistor model;
  (f) assuming a junction voltage level between the first transistor model and the second transistor model;
  (g) calculating a channel current of the first transistor model based on the junction voltage;
  (h) calculating a channel current of the second transistor model based on the junction voltage;
  (i) repeating steps (f) through (h) until the channel current of the first transistor model substantially equals the channel current of the second transistor model; and
  (j) combining the first transistor model and the second transistor model to form a composite transistor model for the transistor.

37. A method for modeling a graded channel MOSFET, wherein the graded channel MOSFET has a first channel portion and a second channel portion, wherein a doping concentration of the first channel portion is greater than a doping concentration of the second channel portion, the method comprising the steps of:
- (a) modeling the first channel portion, which has a doping concentration greater than the doping concentration of the second channel portion, as having a uniform doping concentration to determine a first transistor model;
- (b) modeling the second channel portion as having a uniform doping concentration less than the doping concentration of the first channel portion to determine a second transistor model, the first channel portion being laterally adjacent the second channel portion wherein both the first and second channel portions are adjacent a gate-oxide-to-channel-region interface of the graded channel MOSFET so that the first and second transistor models have serially coupled channel regions:
- (c) calculating the parameters of the first transistor model and the second transistor model such that a channel current of the first transistor model equals a channel current of the second transistor model.

38. The method of claim 37 further comprising the step of:
- (d) combining the first transistor model and the second transistor model to create a composite transistor model.

39. A computer readable medium, wherein the computer readable medium comprises:
- (a) instructions for receiving parameters relating to the geometry of a transistor, the transistor comprising a drain, a source, a gate and a channel region, wherein the channel region comprises a first channel portion and a second channel portion, wherein the first channel portion has a doping concentration greater than a doping concentration of the second channel portion, the parameters including a geometry and a doping concentration of the first channel portion and a geometry and a doping concentration of the second channel portion;
- (b) instructions for determining a first transistor model, wherein the first transistor model represents the first channel portion, wherein the first transistor model is based on the geometry and doping of the first channel portion, and wherein the first transistor model assumes a uniform doping concentration;
- (c) instructions for determining a second transistor model, wherein the second transistor model represents the second channel portion, wherein the second transistor model is based on the geometry and doping of the second channel portion, and wherein the second transistor model assumes a uniform doping concentration;
- (d) instructions for assuming a junction voltage level at an interface between the first transistor model and the second transistor model;
- (e) instructions for determining a channel current of the first transistor model based on the junction voltage;
- (f) instructions for determining a channel current of the second transistor model based on the junction voltage;
- (g) instructions for adjusting the junction voltage level until the channel current of the first transistor model substantially equals the channel current of the second transistor model; and
- (h) instructions for combining the first transistor model and the second transistor model to form a composite transistor model for the transistor.

40. A method for modeling a graded complementary metal oxide semiconductor (GCMOS) device having a first channel region portion with a first doping concentration and a second channel region portion with a second doping concentration, the first channel region portion and the second channel region portion defining a total channel length of the GCMOS device, the method comprising the steps of:
- providing a file in memory that contains a plurality of transistors which are collectively interconnected to form an integrated circuit;
- identifying the GCMOS device among the plurality of transistors in memory;
- determining a first parameter for the GCMOS device which is equal to an effective length of the first channel portion;
- determining a second parameter for the GCMOS device which is equal to an fixed doping concentration wherein the fixed doping concentration is a numerically constant approximation of the first doping concentration of the first channel region portion;
- determining at least one third parameter for the GCMOS device which is used to adjust one of either the first or second parameter as a function of the total channel length of the GCMOS device;
- determining at least one fourth parameter for the GCMOS device which is used to model the GCMOS device for reverse operation; and
- using the first, second, third, and fourth parameters to verify a correct operation of the integrated circuit.

41. A method for modeling a graded complementary metal oxide semiconductor (GCMOS) device having a first channel region portion with a first doping concentration and a second channel region portion with a second doping concentration, the first channel region portion and the second channel region portion defining a total channel length of the GCMOS device, the method comprising the steps of:
- providing a file in memory that contains a plurality of transistors which are collectively interconnected to form an integrated circuit;
- identifying the GCMOS device among the plurality of transistors in memory;
- determining a first set of parameters for the GCMOS device which model the GCMOS device when in a forward mode of operation;
- determining a second set of parameters for the GCMOS device which model the GCMOS device when in a reverse mode of operation;
- using the first and second set of parameters to determine if the plurality of transistors are functioning properly; and
- altering the file in memory to alter the plurality of transistors in the integrated circuit when a determination is made that the transistors are not functioning properly.

42. The method of claim 41 wherein the first and second set of parameters are included along with a plurality of additional parameters to fully model an entire operation of the GCMOS device on a central processing unit (CPU) which has access to the file in memory.

43. A method for modeling a graded complementary metal oxide semiconductor (GCMOS) device having a first channel region portion with a first doping concentration and a second channel region portion with a second doping concentration, the first channel region portion and the second channel region portion defining a total channel length of the GCMOS device, the method comprising the steps of:
- providing a file in memory that contains a plurality of transistors which are collectively interconnected to form an integrated circuit;

identifying the GCMOS device among the plurality of transistors in memory, the GCMOS device having a higher maximum transconductance spike as a function of gate voltage when compared to a conventional CMOS device with a substantially uniform channel doping concentration and having a jog in capacitance as a function of gate voltage when compared to a conventional CMOS device with a substantially uniform channel doping concentration;

determining a set of parameters for the GCMOS device which model the higher maximum transconductance spike as a function of gate voltage and the jog in capacitance as a function of gate voltage inherent in the GCMOS device;

using the set of parameters to determine if the plurality of transistors are functioning properly within the file in memory; and altering the file in memory to alter the plurality of transistors in the integrated circuit when a determination is made that the transistors are not functioning properly.

* * * * *

UNITED STATES PATENT AND TRADEMARK OFFICE
CERTIFICATE OF CORRECTION

PATENT NO: 5,687,355

DATED: November 11, 1997

INVENTORS: Kuntal Joardar et al

It is certified that error appears in the above-identified patent and that said Letters Patent is hereby corrected as shown below:

Column 25, line 13, delete [P1]; move "a first transistor model . . ." to begin a new indented paragraph Column 29, line 16, change "region:" to --region;--

Signed and Sealed this

Twenty-third Day of June, 1998

*Attest:*

BRUCE LEHMAN

*Attesting Officer*     *Commissioner of Patents and Trademarks*